(12) United States Patent
Kaneko et al.

(10) Patent No.: US 9,253,897 B2
(45) Date of Patent: Feb. 2, 2016

(54) WIRING SUBSTRATE AND METHOD FOR MANUFACTURING THE SAME

(71) Applicant: SHINKO ELECTRIC INDUSTRIES CO., LTD., Nagano-shi, Nagano (JP)

(72) Inventors: Kentaro Kaneko, Nagano (JP); Katsuya Fukase, Nagano (JP); Kazuhiro Kobayashi, Nagano (JP)

(73) Assignee: SHINKO ELECTRIC INDUSTRIES CO., LTD., Nagano-Shi (JP)

( * ) Notice: Subject to any disclaimer, the term of this patent is extended or adjusted under 35 U.S.C. 154(b) by 0 days.

(21) Appl. No.: 14/329,073

(22) Filed: Jul. 11, 2014

(65) Prior Publication Data

US 2015/0014020 A1 Jan. 15, 2015

(30) Foreign Application Priority Data

Jul. 11, 2013 (JP) ................................. 2013-145915
May 27, 2014 (JP) ................................. 2014-109392

(51) Int. Cl.
| | |
|---|---|
| H05K 1/03 | (2006.01) |
| H05K 1/00 | (2006.01) |
| H05K 1/09 | (2006.01) |
| H05K 7/10 | (2006.01) |
| H05K 3/40 | (2006.01) |
| H05K 3/46 | (2006.01) |

(52) U.S. Cl.
CPC .............. *H05K 3/4007* (2013.01); *H05K 3/465* (2013.01); *H05K 2203/0392* (2013.01); *H05K 2203/1461* (2013.01); *H05K 2203/1563* (2013.01)

(58) Field of Classification Search
CPC ............ H05K 2201/09472; H05K 2203/0307; H05K 3/4007
USPC ................... 174/250, 251, 255, 258; 361/767
See application file for complete search history.

(56) References Cited

U.S. PATENT DOCUMENTS

| | | | | |
|---|---|---|---|---|
| 5,741,575 A * | 4/1998 | Asai | ....................... | C08G 59/18 361/748 |
| 7,612,445 B2 * | 11/2009 | Murai | ................. | H01L 23/3128 257/692 |
| 8,258,409 B2 * | 9/2012 | Kohara | ............... | H01L 23/3128 174/261 |

(Continued)

FOREIGN PATENT DOCUMENTS

JP 2012-209580 10/2012

OTHER PUBLICATIONS

This application is co-pending with U.S. Appl. No. 14/329,062, filed Jul. 11, 2014.

*Primary Examiner* — Sherman Ng

(74) *Attorney, Agent, or Firm* — Rankin, Hill & Clark LLP

(57) ABSTRACT

A wiring substrate includes an insulating layer, a first pad, and a solder resist layer. The first pad is embedded in the insulating layer. The solder resist layer is provided on an upper surface of the insulating layer. The solder resist layer is formed with an opening portion through which the recess portion is exposed. An adjacent portion of the solder resist layer adjacent to a peripheral portion of the opening portion covers a peripheral portion of the upper surface of the first pad and protrudes from the peripheral portion of the upper surface of the first pad toward the center portion of the first pad so as to cover above the recess portion. Surfaces of the first pad being in contact with the insulating layer are smaller in roughness than the upper surface of the insulating layer and the peripheral portion of the upper surface of the first pad.

14 Claims, 13 Drawing Sheets

(56) References Cited

U.S. PATENT DOCUMENTS

| | | | | |
|---|---|---|---|---|
| 2008/0245549 A1* | 10/2008 | Kodani | ................. | H05K 3/205 174/126.1 |
| 2009/0095514 A1 | 4/2009 | Kaneko | | |
| 2010/0083495 A1* | 4/2010 | Hirayama | .............. | H05K 1/187 29/839 |
| 2012/0222894 A1* | 9/2012 | Kaneko | ................. | H05K 3/244 174/257 |

* cited by examiner

WIRING SUBSTRATE AND METHOD FOR MANUFACTURING THE SAME

CROSS-REFERENCE TO RELATED APPLICATION(S)

This application claims priority from Japanese Patent Application Nos. 2013-145915 (filed on Jul. 11, 2013) and 2014-109392 (filed on May 27, 2014), the entire contents of which are herein incorporated by reference.

BACKGROUND

1. Field

Exemplary embodiments of the invention relate to a wiring substrate and a method for manufacturing the wiring substrate.

2. Related Art

What is called build-up wiring substrates are known in which wiring layers and insulating layers are stacked alternately and the wiring layers are connected to each other through via holes which penetrate through the insulating layers. For example, such build-up wiring substrates are manufactured by stacking wiring layers and insulating layers on a support body and then removing the support body.

In a manufacturing process of a build-up wiring substrate, a surface of a support body may be roughened. In this case, when the support body is removed, the roughened surface of the support body is transferred to an insulating layer or the like that has been formed on the support body. Therefore, when a solder resist layer, an underfill resin, or the like is formed on the roughened surface of the insulating layer after the removal of the support body, adhesion property between the insulating layer and the solder resist layer, underfill resin, or the like can be improved (for example, see JP 2012-209580 A (corresponding to US 2009/0095514 A).

SUMMARY

However, in the above-described manufacturing process of the build-up wiring substrate, the roughened surface of the support body are also transferred to surfaces of pads to be connected to, for example, electrodes of a semiconductor chip, and even the surfaces of the pads are roughened. As a result, the surfaces of the pads are lowered in solder wettability, which may lead to that it is difficult to sufficiently ensure the reliability of connections between the pads of the build-up wiring substrate and, for example, the electrodes of the semiconductor chip.

Exemplary embodiments of the invention have been made in view of the above circumstances, and provide a wiring substrate, etc. having pads which can enhance the reliability of connections with connection targets.

According to one exemplary embodiment, a wiring substrate includes an insulating layer, a first pad, and a solder resist layer. The first pad is embedded in the insulating layer. An upper surface of the first pad is exposed from an upper surface of the insulating layer. The first pad is formed with a recess portion, having a smooth bottom surface, at a center portion of the upper surface of the first pad. The solder resist layer is provided on the upper surface of the insulating layer. The solder resist layer is formed with an opening portion through which the recess portion is exposed. An adjacent portion of the solder resist layer adjacent to a peripheral portion of the opening portion covers a peripheral portion of the upper surface of the first pad. The adjacent portion of the solder resist layer protrudes from the peripheral portion of the upper surface of the first pad toward the center portion of the first pad so as to cover above the recess portion. The upper surface of the insulating layer, surfaces of the first pad being in contact with the insulating layer, and the peripheral portion of the upper surface of the first pad are roughened. The surfaces of the first pad being in contact with the insulating layer are smaller in roughness than the upper surface of the insulating layer and the peripheral portion of the upper surface of the first pad.

The disclosed technique makes it possible to provide a wiring substrate etc. having pads which can increase the reliability of connections to connection targets.

DETAILED DESCRIPTION

Figure 1A:
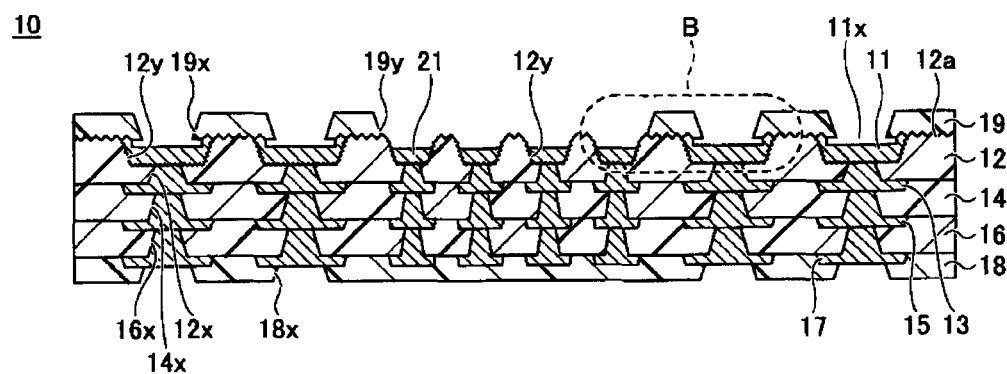
FIG. 1A is a section view, taken along a line A-A in FIG. 2, of a wiring substrate according to a first exemplary embodiment of the invention.

Exemplary embodiments of the invention will be hereinafter described with reference to the drawings. In the drawings, the same constituent members will be given the same reference symbol and may not be described redundantly.

<First Exemplary Embodiment>
[Structure of Wiring Substrate According to First Exemplary Embodiment]

Figure 1B:
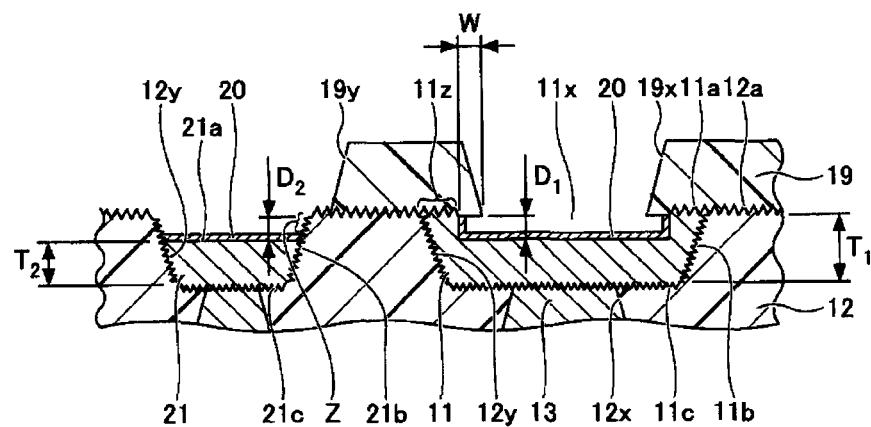
FIG. 1B is an enlarged section view of part B of FIG. 1A.
Figure 2:
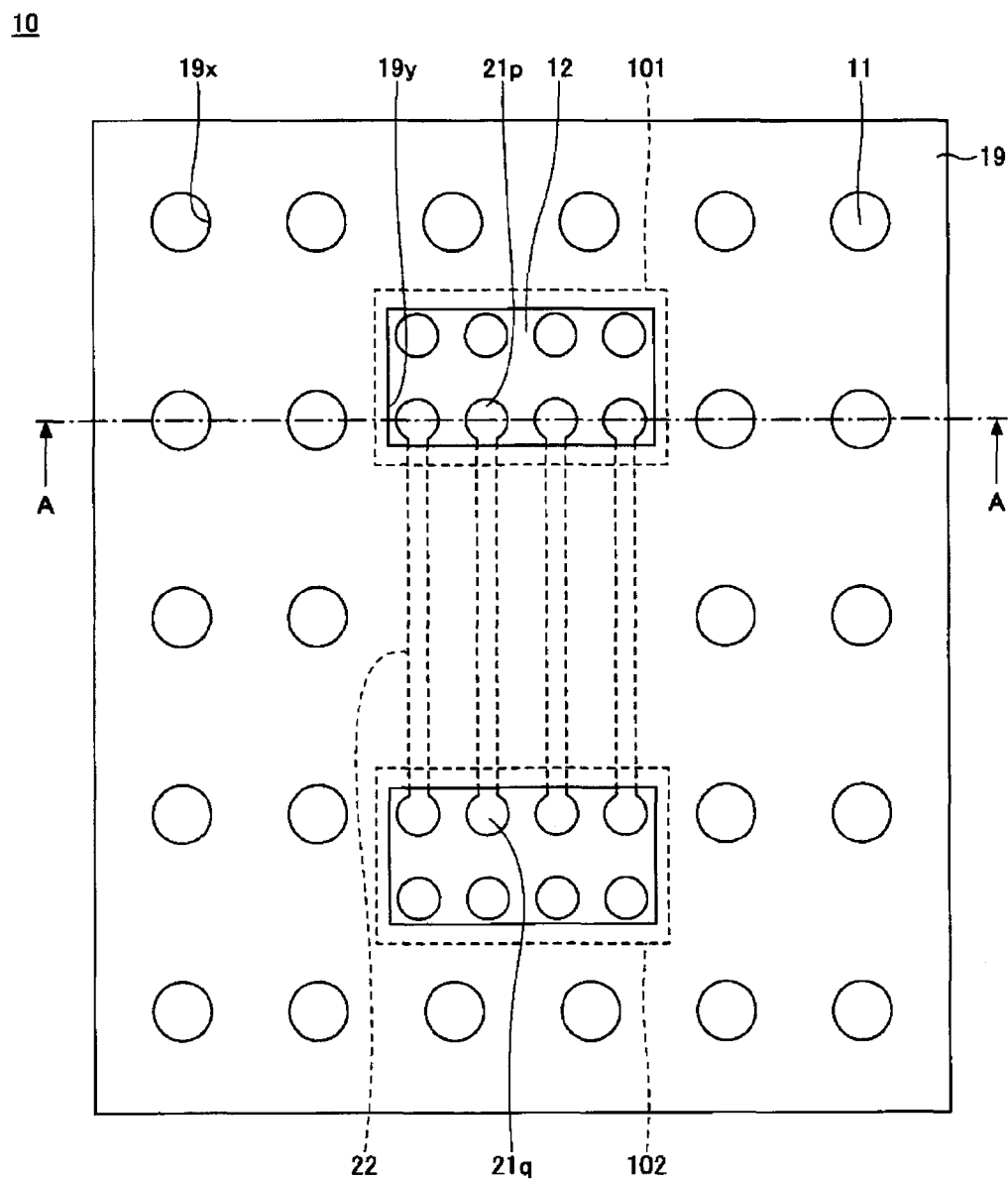
FIG. 2 is a plan view of the wiring substrate according to the first exemplary embodiment.

First, a structure of a wiring substrate according to a first exemplary embodiment will be described. FIGS. 1A to 1C are section views of the wiring substrate according to the first exemplary embodiment. FIG. 2 is a plan view of the wiring substrate according to the first exemplary embodiment. FIG. 1A is a section view taken along line A-A in FIG. 2. FIG. 1B is an enlarged section view of a part B of FIG. 1A. Also, surface treatment layers 20 are omitted in FIGS. 1A and 2.

Referring to FIGS. 1A, 1B and 2, the wiring substrate 10 has first pads 11, an insulating layer 12, a wiring layer 13, an insulating layer 14, a wiring layer 15, an insulating layer 16, a wiring layer 17, solder resist layers 18 and 19, surface treatment layers 20, second pads 21, and wiring patterns 22. The wiring substrate 10 is a so-called coreless build-up wiring substrate.

Referring to FIG. 2, the wiring substrate 10 can be mounted with plural semiconductor chips. Broken-line rectangles 101 and 102 indicate positions where semiconductor chips 101 and 102 are to be mounted. Second pads 21p (ones of the second pads 21) are pads to be connected to electrodes of the semiconductor chip 101, and second pads 21q (the other ones of the second pads 21) are pads to be connected to the electrodes of the semiconductor chip 102. The second pads 21p are electrically connected to the second pads 21q by the wiring patterns 22. The second pads 21p to be connected to the electrodes of the semiconductor chip 101 may be arranged in plural rows (in the example shown in FIG. 2, arranged in two rows). Also, the second pads 21q to be connected to the electrodes of the semiconductor chip 102 may be arranged in plural rows (in the example shown in FIG. 2, arranged in two rows). The semiconductor chips 101 and 102 may have the same functions or different functions.

In the first exemplary embodiment, for the sake of convenience, a solder resist layer 19 side of each element may be referred to as an upper side or one side of each element, and a solder resist layer 18 side of each element may be referred to as a lower side or another side (or the other side) of each element. Also, a surface of each element located on the solder resist layer 19 side may be referred to as an upper surface or one surface of each element, and another surface (or the other surface) of each element located on the solder resist layer 18 side may be referred to as a lower surface or another surface (or the other surface) of each element. The term "plan view" means viewing an object in a direction normal to an upper surface 12a of the insulating layer 12. Also, the term "plan-view shape" means a shape of an object when viewed in the direction normal to the upper surface 12a of the insulating layer 12. Since the wiring patterns 22 are similar in structure to the second pads 21, the wiring patterns 22 may not be shown in the drawings or not given reference symbols, and descriptions thereon may be omitted.

In the wiring substrate 10, the insulating layer 12 is a layer on which the first pads 11, the second pads 21, and the wiring patterns 22 are formed. However, other wiring patterns for connecting the first pads 11 to the second pads 21 or other wiring patterns for connecting the first pads 11 to each other may be formed on the insulating layer 12. For example, the insulating layer 12 may be made of a material containing, as a main component, an insulating resin such as a thermosetting epoxy-based resin. The insulating layer 12 may contain a filler such as silica ($SiO_2$). The insulating layer 12 may be, for example, about 15 to 35 μm in thickness.

The upper surface 12a of the insulating layer 12 is a roughened surface. The roughness Ra of the upper surface 12a of the insulating layer 12 may be equal to or higher than about 0.3 μm and lower than about 0.5 μm. The roughness may be measured using a light interference type instrument, for example. Since the upper surface 12a of the insulating layer 12 is the roughened surface, the adhesion property between the upper surface 12a of the insulating layer 12 and the solder resist layer 19, which is formed on the upper surface 12a, can be enhanced.

The first pads 11 are embedded in the insulating layer 12. The first pads 11 are provide in recess portions 12y formed in the upper layer 12a of the insulating layer 12. Upper surfaces 11a of the first pads 11 are exposed from the upper surface 12a of the insulating layer 12. Each first pad 11 may have, for example, a circular shape in plan view. Also, each first pad 11 may have, for example, a tapered shape in section. A width of the tapered shape in a vicinity of a lower surface 11c of the first pad 11 is narrower that of the tapered shape in a vicinity of the upper surface 12a of the insulating layer 12. Each first pad 11 may have, for example, an inverted cone frustum shape.

A portion, other than an upper peripheral portion 11z, of each first pad 11 (a center portion of each first pad 11) is formed with a recess portion 11x whose bottom surface and inner wall surface are smooth surfaces. The roughness Ra of the bottom surface (smooth surface) of the recess portion 11x may be, for example, equal to or higher than about 0.1 μm and lower than about 0.2 μm. Since the inner wall surface (smooth surface) of the recess portion 11x is formed by a similar process to a process for forming the bottom surface of the recess portion 11x, the roughness of the inner wall surface of the recess portion 11x can be approximately the same as that of the bottom surface of the recess portion 11x. For convenience of description, the bottom surface and the inner wall surface will be described together. A material of the first pads 11 may be, for example, copper. The thickness T1 of the first pads 11 may be, for example, about 10 μm. The depth $D_1$ of the recess portion 11x as measured from the upper surface 12a of the insulating layer 12 may be, for example, about 1 to 2 μm.

The upper surface 11a of each first pad 11 is flush with the upper surface 12a of the insulating layer 12.

The second pads 21 are embedded in the insulating layer 12. The second pads 21 are provided in the recess portions 12y formed in the upper surface 12a of the insulating layer 12. Upper surfaces 21a of the second pads 21 are exposed toward an inside of the recess portions 12y. More specifically, the upper surfaces 21a of the second pads 21 are at a lower level than the upper surface 12a of the insulating layer 12. Therefore, a step portion Z where an inner wall surface of each recess portion 12y is exposed is formed between the upper surface 21a of the corresponding second pad 21 and the upper surface 12a of the insulating layer 12. The step portion Z is a roughened surface. The upper surfaces 21a of the second pads 21 may be at the same level as (may be flush with) the bottom surfaces of the recess portions 11x.

The wiring patterns 22 are embedded in the insulating layer 12. The wiring patterns 22 are provided in the recess portions 12y formed in the upper surface 12a of the insulating layer 12. Upper surfaces of the wiring patterns 22 are flush with the upper surface 12a of the insulating layer 12.

The second pads 21 have a smaller plan-view shape than the first pads 11. This is because the first pads 11 are to be electrically connected to another wiring substrate, a semiconductor package, or the like whereas the second pads 21 are to be connected to the electrodes of the semiconductor chips 101 and 102. Each second pad 21 may have, for example, a circular shape in plan view. Each of the second pads 21 and the wiring patterns 22 may have a tapered shape in section. A width of the tapered shape on a lower surface 21c side is narrower than that of the tapered shape in a vicinity of the upper side 12a of the insulating layer 12. Each second pad 12 may have, for example, an inverted cone frustum shape. The upper surfaces 21a of the second pads 21 are smooth surfaces. The roughness Ra of the upper surfaces 21a of the second pads 21 may be, for example, equal to or higher than about 0.1 μm and lower than about 0.2 μm.

Materials of the second pads 21 and the wiring patterns 22 may be, for example, copper. The thickness $T_2$ of the second pads 21 and the wiring patterns 22 may be, for example, in a range of about 8 to 9 μm. The depth $D_2$ of the second pads 21 as measured from the upper surface 12a of the insulating layer 12 may be approximately the same as the depth $D_1$, and may be, for example, in a range of about 1 to 2 μm. The thickness of the wiring patterns 22 may be approximately the same as the thickness $T_1$ of the first pads 11 and may be, for example, about 10 μm.

The upper peripheral portion 11z of each first pad 11 (a surface being in contact with an corresponding protrusion portion on a lower surface of the solder resist layer 19) is a roughened surface. The roughness Ra of the upper peripheral portions 11z of the first pads 11 may be, for example, equal to or higher than about 0.3 μm and lower than about 0.5 μm. This provides an anchor effect, whereby the adhesion property between the first pads 11 and the solder resist layer 19 can be enhanced.

(i) Lower surfaces 11c and side surfaces 11b, being in contact with the insulating layer 12, of the first pads 11, (ii) lower surfaces 21c and side surfaces 21b, being in contact with the second pads 21, and (iii) lower surfaces and side surfaces of the wiring patterns 22 are roughened surfaces. Te lower surfaces 11c of the first pads 11, the lower surfaces 21c of the second pads 21, and the lower surfaces of the wiring patterns 22 are lower in roughness than the upper surface 12a of the insulating layer 12 and the upper peripheral portions 11z of the first pads 11. The roughness Ra of the lower surfaces 11c of the first pads 11, the lower surfaces 21c of the second pads 21, and the lower surfaces of the wiring patterns 22 may be, for example, equal to or higher than about 0.2 μm and lower than about 0.3 μm. This provides an anchor effect, whereby the adhesion property between (i) the first pads 11, the second pads 21, and the wiring patterns 22 and (ii) the insulating layer 12 can be enhanced, and peeling-off or a crack between (i) the first pads 11, the second pads 21, the wiring patterns 22 and (ii) the insulating layer 12 due to stress can be prevented.

The side surfaces 11b (roughened surfaces) of the first pads 11, the side surfaces 21b (roughened surfaces) of the second pads 21 and the side surfaces (roughened surfaces) of the wiring patterns 22 are formed by a similar process to a process for the lower surfaces 11c of the first pads 11, the lower surfaces 21c of the second pads 21 and the lower surfaces of the wiring patterns 22, respectively. Therefore, the roughness of the side surfaces 11b of the first pads 11, the side surfaces 21b of the second pads 21, and the side surfaces of the wiring patterns 22 can be approximately the same as that of the lower surfaces 11c of the first pads 11, the lower surfaces 21c of the second pads 21 and the lower surfaces of the wiring patterns 22, respectively. For convenience of description, the lower surfaces and inner side surfaces thereof will be described together.

The reason why the roughness of the lower surfaces and side surfaces of the first pads 11, the second pads 21, and the wiring patterns 22 are lower than that of the upper surface 12a of the insulating layer 12 and that of the upper peripheral portions 11z is as follows. That is, if the roughness of the lower surfaces and side surfaces of the first pads 11, the second pads 21, and the wiring patterns 22 were high, the first pads 11, the second pads 21, and the wiring patterns 22 would be narrower, which makes it difficult to secure the transmission reliability.

The solder resist layer 19 is formed on the upper surface 12a of the insulating layer 12. The solder resist layer 19 is formed with opening portions 19x through which the recess portions 11x of the first pads 11 are exposed. The solder resist layer 19 is also formed with opening portions 19y (an example of "another opening portion") each of which exposes the upper surfaces 21a of the plural corresponding second pads 21. Each opening portion 19x may have, for example, a circular shape in section. Also, each opening portion 19y may have, for example, a rectangular shape in section.

An adjacent portion of the solder resist layer 19 adjacent to a peripheral portion of each opening portion 19x covers the upper peripheral portion 11z of the corresponding first pad 11. The solder resist layer 19 which covers the upper peripheral portion 11z of each first pad 11 protrudes the upper peripheral portion 11z of each first pad 11 laterally (in a horizontal direction; toward the center portion of each first pad 11) so as to cover above the recess portion 11x of each first pad 11. More specifically, the solder resist layer 19 protrudes from the upper peripheral portion 11z of each first pad 11 laterally so as to have an eave shape that covers above the recess portion 11x of each first pad 11. A width W of the eave-shape protrusion portion of the solder resist layer 19 over the recess portion 11x may be, for example, in a range of about 1 to 2 μm. A material of the solder resist layer 19 may be a photosensitive epoxy-based insulating resin. The solder resist layer 19 may be, for example, in a range of about 15 to 35 μm in thickness.

As described above, the solder resist layer 19 covers the upper peripheral portion 11z of each first pad 11. Therefore, the first pads 11 can be prevented more reliably from coming off due to stress that occurs when another wiring substrate, a semiconductor package, or the like is mounted, in comparison with the case where the solder resist layer 19 does not cover the upper peripheral portion 11z of each first pad 11. Also, the solder resist layer 19 protrudes so as to have the eave shape to cover above each recess portion 11x. Therefore, when solder or the like is formed in the recess portions 11x in mounting another wiring substrate, a semiconductor package, or the like, the eave-shape protrusion portions serve as wedges, and the solder or the like can thereby be prevented from coming off.

A surface treatment layer 20 is formed in each recess portion 11x, which is exposed to the corresponding opening portion 19x of the solder resist layer 19, so as not to fill each recess portion 11x. Each surface treatment layer 20 covers the bottom surface and inner wall surface of the corresponding recess portion 11x. In other words, the surface treatment layer 20 is formed to have a bottom surface and an inner wall surface which conform in shape to each recess portion 11x. Also, a surface treatment layer 20 which is similar to the one covering the bottom surface and inner wall surface of the recess portion 11x of each first pad 11 is formed on the upper surface 21a of each second pad 21 which is exposed to the corresponding opening portion 19y of the solder resist layer 19. The surface treatment layer 20 formed on each second pad 21 is at a lower level than the upper surface 12a of the insulating layer 12.

Each surface treatment layer 20 may be an Au layer, an Ni/Au layer (a metal layer formed by stacking an Ni layer and an Au layer in this order), an Ni/Pd/Au layer (a metal layer formed by stacking an Ni layer, a Pd layer, and an Au layer in this order), or the like. Alternatively, the surface treatment layers 20 may be formed by performing anti-oxidation treatment such as OSP (organic solderability preservative) treatment. The surface treatment layers 20 may be, for example, in a range of about 0.5 to 1 μm in thickness.

The portions of the first pads 11 where the surface treatment layers 20 are formed can be electrically connected to another wiring substrate, a semiconductor package, or the like. The portions of the second pads 21 where the surface treatment layers 20 are formed can be electrically connected to semiconductor chips such as the semiconductor chip 101 and 102. Therefore, the second pads 21 may have a smaller diameter and be arranged at a narrower pitch than the first pads 11.

As described above, the bottom surfaces of the recess portions 11x and the upper surfaces of the second pads 21 are the smooth surfaces rather than roughened surfaces. Therefore, the upper surface of the surface treatment layer 20 which are formed on the bottom surfaces of the recess portion 11x or the upper surfaces of the second pads 21 are also smooth surfaces. If the bottom surfaces of the recess portions 11x and the upper surfaces of the second pads 21 were to be roughened surfaces, the thickness of the surface treatment layers 20 would readily vary due to the roughness of the bottom surfaces of the recess portions 11x and the upper surfaces of the second pads 21. In contrast, in the first exemplary embodiment, the bottom surfaces of the recess portion 11x and the upper surfaces of the second pads 21 are the smooth surfaces. Therefore, the thickness of the surface treatment layers 20 can be made uniform.

As a result, the solder wettability is enhanced, for example, when electrodes of another wiring substrate, a semiconductor package, a semiconductor chip or the like to the respective surface treatment layers 20 via solder. Therefore, the reliability of connections between the wiring substrate 10 and the semiconductor chip or the like can be enhanced.

The wiring layer 13 is formed under the insulating layer 12. The wiring layer 13 includes via wirings and wiring patterns. The via wirings fill respective via holes 12x which penetrate through the insulating layer 12 to expose the lower surfaces 11c and 21c of the first and second pads 11, 21. The wiring patterns are formed on the lower surface of the insulating layer 12. Each via hole 12x may be a recess portion having a cone frustum shape so that a diameter of an opening portion which opens to the insulating layer 14 side is larger than a diameter of an opening portion which is exposed to the lower surface 11c or 21c of the corresponding first or second pad 11, 21. In other words, each via wiring that is connected to the lower surface 11c or 21c of the corresponding first or second pad 11, 21 has a tapered shape in section that is wider on an opposite side to the upper surface 12a side of the insulating layer 12.

The wiring layer 13 is electrically connected to the first and second pads 11, 21 which are exposed to the opening portions of the via holes 12x. A material of the wiring layer 13 may be, for example, copper (Cu). The wiring patterns of the wiring layer 13 may be, for example, in a range of about 10 to 20 µm in thickness. Also, there may be pads 11 or second pads 21 that are not connected to any via wirings of the wiring layer 13.

The insulating layer 14 is formed on the lower surface of the insulating layer 12 so as to cover the wiring layer 13. A material of the insulating layer 14 may be, for example, the same insulating resin as the insulating layer 12. The insulating layer 14 may contain a filler such as silica ($SiO_2$). The insulating layer 14 may be, for example, in a range of about 15 to 35 µm in thickness.

The wiring layer 15 is formed under the insulating layer 14. The wiring layer 15 includes via wirings and wiring patterns. The via wirings fill respective via holes 14x which penetrate through the insulating layer 14 to expose a lower surface of the wiring layer 13. The wiring patterns are formed on a lower surface of the insulating layer 14. Each via hole 14x may be a recess portion having a cone frustum shape so that a diameter of an opening portion which opens to the insulating layer 16 side is larger than a diameter of an opening portion which is exposed to the lower surface of the wiring layer 13.

The wiring layer 15 is electrically connected to the wiring layer 13 exposed to the opening portions of the via holes 14x. A material of the wiring layer 15 may be, for example, copper (Cu). The wiring patterns of the wiring layer 15 may be, for example, in a range of about 10 to 20 µm in thickness.

The insulating layer 16 is formed on the lower surface of the insulating layer 14 so as to cover the wiring layer 15. The insulating layer 16 may be made of the same insulating resin as the insulating layer 12. The insulating layer 16 may contain a filler such as silica ($SiO_2$). The insulating layer 16 may be, for example, in a range of about 15 to 35 µm in thickness.

The wiring layer 17 is formed under the insulating layer 16. The wiring layer 17 includes via wirings and wiring patterns. The via wirings fill respective via holes 16x which penetrate through the insulating layer 16 to expose a lower surface of the wiring layer 15. The wiring patterns are formed on a lower surface of the insulating layer 16. Each via hole 16x may be a recess portion having a cone frustum shape so that a diameter of an opening portion which opens to the solder resist layer 18 side is larger than a diameter of an opening portion which is exposed to the lower surface of the wiring layer 15.

The wiring layer 17 is electrically connected to the wiring layer 15 exposed to the opening portions of the via holes 16x. A material of the wiring layer 17 may be, for example, copper (Cu). The wiring patterns of the wiring layer 17 may be, for example, in a range of about 10 to 20 µm in thickness.

The solder resist layer 18 is formed on the lower surface of the insulating layer 16 so as to cover the wiring layer 17. The solder resist layer 18 has opening portions 18x. Portions of the wiring layer 17 are exposed to the opening portions 18x. The wiring layer 17, exposed to the opening portions 18x, serves as pads to be electrically connected to another wiring substrate, a semiconductor package, or the like. A material of the solder resist layer 18 may be, for example, a photosensitive epoxy-based insulating resin. The solder resist layer 18 may be, for example, in a range of about 15 to 35 µm in thickness.

If necessary, metal layers may be formed on the lower surfaces of the wiring layer 17 which is exposed to the opening portions 18x. An example of the metal layers has been described above. Alternatively, the lower surface of the wiring layer 17 which is exposed to the opening portions 18x may be subjected to anti-oxidation treatment such as OSP treatment.

In the wiring substrate 10, a part of the wiring patterns of the wiring layer 17 may be formed so as to extend to the lower surface of the insulating layer 16, the part of the wiring patterns extended to the lower surface of the insulating layer 16 may be exposed through the opening portions 18x of the solder resist layer 18 so as to serve as pads. That is, portions, other than the wiring lines filling the via holes 16x, of the wiring layer 17 may serve as pads.

[Method for Manufacturing Wiring Substrate According to First Exemplary Embodiment]

Next, a method for manufacturing the wiring substrate according to the first exemplary embodiment will be described. FIGS. 3A to 6B are section views illustrating processes for manufacturing the wiring substrate according to the first exemplary embodiment. In the first exemplary embodiment, plural parts to become plural wiring substrates are formed on a support body and are divided into individual parts after removal of the support body. However, one wiring substrate may be formed on a support body, and the support body may be removed thereafter.

Figure 3A:
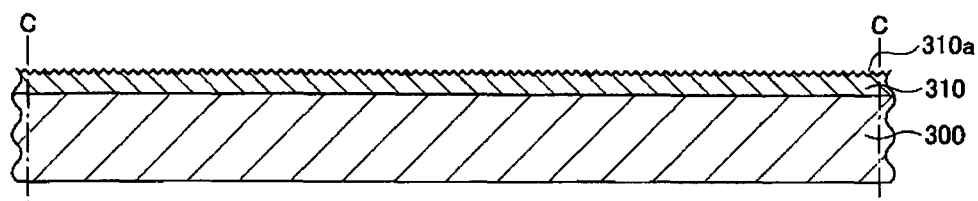
FIGS. 3A to 3D are a first set of section views illustrating a manufacturing process of the wiring substrate according to the first exemplary embodiment.

First, in a step of FIG. 3A, a support body 300 is prepared, and a metal layer 310 one surface of which is a roughened surface 310a is formed on the support body 300. The support body 300 may be any of a silicon plate, a glass plate, a metal plate, a metal foil, etc. In the first exemplary embodiment, the support body 300 is a copper foil. This is because the copper foil can be used as a power supply layer when electrolytic plating is performed in later steps such as a step of FIG. 3C and can be easily removed by etching in a later step of FIG. 5B. The support body 300 may be, for example, about 35 to 100 μm in thickness.

The metal layer 310 may be made of such a material as to be able to be selectively removed by etching with respect to the support body 300. In the first exemplary embodiment, since the support body 300 is the copper foil, the metal layer 310 may be made of, for example, nickel (Ni) which can be selectively removed with respect to copper. Alternatively, the metal layer may be any of cobalt (Co), chromium (Cr), aluminum (Al), palladium (Pd), tin (Sn), and iron (Fe) instead of nickel (Ni). The metal layer 310 may be, for example, about 10 μm in thickness.

In the first exemplary embodiment, description will be given on the case where the metal layer 310 is made of nickel (Ni). For example, the metal layer 310 having the roughened surface 310a can be formed by electrolytic plating using a plating solution that is a mixture of nickel sulfate, boric acid, nickel chloride, etc. During the plating, the support body 300 can be used as a power supply layer. By properly adjusting the composition of the used plating solution and the current density, the roughened surface 310a having minute asperities is formed on the one surface (located on the opposite side to the support body 300) of the metal layer 310 (nickel layer) which is formed by the electrolytic plating. For example, the roughness Ra of the roughened surface 310a may be equal to or higher than about 0.3 μm and lower than about 0.5 μm.

Figure 3B:
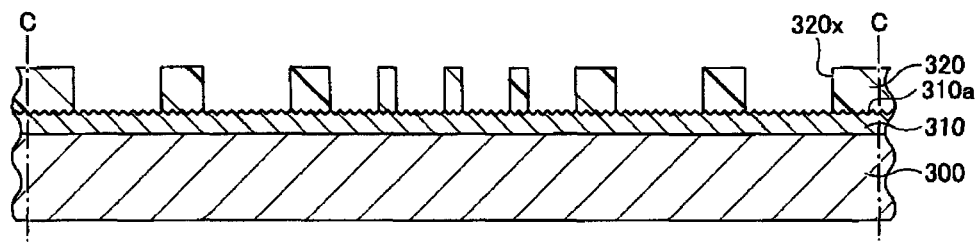

In the subsequent step of FIG. 3B, a resist layer 320 having opening portions 320x in first pad 11 forming regions, second pad 21 forming regions, and wiring pattern 22 forming regions is formed on the one surface (roughened surface 310a) of the metal layer 310. The opening portions 320x in the first pad 11 forming regions and the second pad 21 forming regions may have, for example, a circular shape in plan view. The opening portions 320x in the second pad 21 forming regions may be smaller in diameter and pitch than the opening portions 320x in the first pad 11 forming regions. The plan-view shapes of the opening portions 320x in the wiring pattern 22 forming regions may be formed as desired in accordance with how the wiring patterns 22 extend.

To form the resist layer 320, a liquid or paste resist made of, for example, a photosensitive resin composition containing an epoxy-based resin or an acrylic-based resin is applied to the roughened surface 310a of the metal layer 310. Alternatively, a film resist (e.g., dry film resist) made of, for example, a photosensitive resin composition containing an epoxy-based resin or an acrylic-based resin is laminated on the roughened surface 310a of the metal layer 310.

Then, opening portions 320x are formed by the applied or laminated resist to light and developing the applied or laminated resist. As a result, the resist layer 320 having the opening portions 320x is formed on the roughened surface 310a of the metal layer 310. Alternatively, a film resist which has been formed with opening portions 320x in advance may be laminated on the roughened surface 310a of the metal layer 310.

Figure 3C:
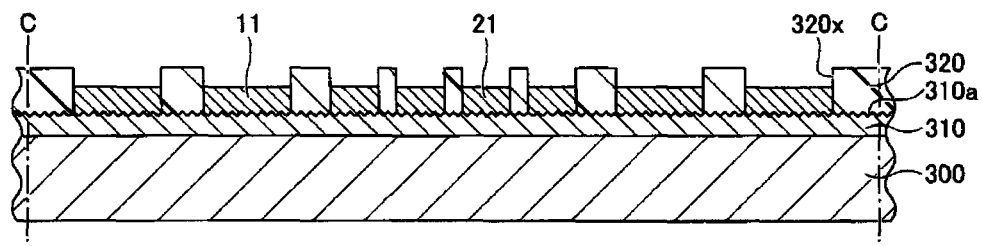

In the subsequent step of FIG. 3C, first pads 11, second pads 21, and wiring patterns 22 (not shown) are formed on the roughened surface 310a of the metal layer 310 which is exposed to an inside of the opening portions 320x by, for example, electrolytic plating using the support body 300 as a plating power supply layer. That is, the first pads 11, the second pads 21, and the wiring patterns 22 are stacked on the roughened surface 310a of the metal layer 310 which is exposed to an inside of the opening portions 320x. A material of the first pads 11, the second pads 21, and the wiring patterns 22 may be, for example, copper (Cu). The first pads 11, he second pads 21, and the wiring patterns 22 may be, for example, about several tens of micrometers in thickness.

Figure 3D:
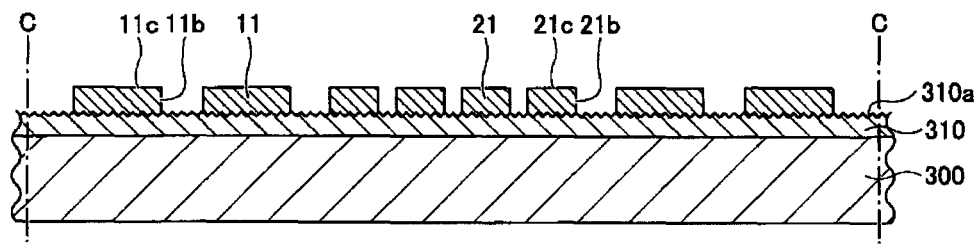

In the subsequent step of FIG. 3D, the resist layer 320 is removed. As a result, the lower surfaces 11c and side surfaces 11b of the first pads 11, lower surfaces 21c and side surfaces 21b of the second pads 21, and surfaces of the wiring patterns 22 (not shown) are exposed. It is noted that although FIGS. 3D to 5C illustrate that the surfaces 11c of the first pads 11 and the surfaces 21c of the second pads 21 are located on a lower side of the first and second pads 11, 21, the surfaces 11a, 21a will be referred to as "lower surfaces" for the sake of convenience. This is because FIGS. 1, 6A, and 6B illustrate the surfaces 11c, 21c are located on an upper side of the first and second pads 11, 21. The same is true for surfaces of the wiring patterns 22.

Figure 4A:
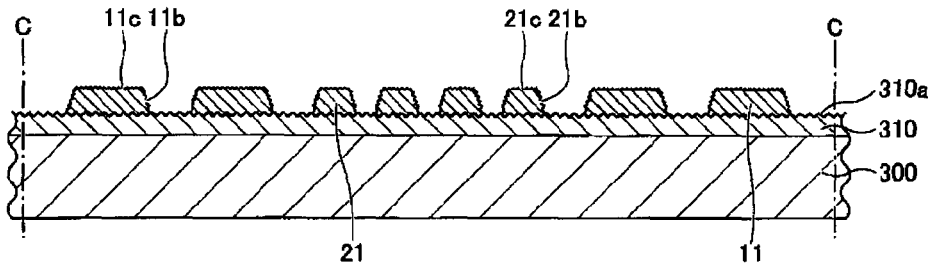
FIGS. 4A to 4D are a second set of section views illustrating the manufacturing process of the wiring substrate according to the first exemplary embodiment.

In the subsequent step of FIG. 4A, surfaces (the lower surfaces 11c, 21c and the side surfaces 11b, 21b) of the first and second pads 11, 21 which are exposed from the metal layer 310 are roughened by etching. Also, surfaces (the lower surfaces and the side surfaces) of the wiring patterns 22 (not shown) which are exposed from the metal layer 310 are roughened by etching. The lower surfaces 11c of the first pads 11, the lower surfaces 21c of the second pads 21, and the lower surfaces of the wiring patterns 22 may be lower in roughness than the roughened surface 310a of metal layer 310. For example, the roughness Ra of the former may be equal to or higher than about 0.2 μm and lower than about 0.3 μm. The roughness of the side surfaces 11b of the first pads 11, the side surfaces 21b of the second pads 21, and the side surfaces of the wiring patterns 22 may be approximately the same as the lower surfaces 11c of the first pads 11, the lower surfaces 21c of the second pads 21, and the lower surfaces of the wiring patterns 22. The roughening may be performed using, for example, a formic-acid-based or acetic-acid-based etching solution. Etching removes a part of the lower surfaces 11c and side surfaces 11b of the first pads 11, the lower surfaces 21c and side surfaces 21b of the second pads 21, and the lower surfaces and side surfaces of the wiring patterns 22. As a result, the side surfaces of the first pads 11, second pads 21, and wiring patterns 22 become slant surfaces. For example, if the first pads 11 and the second pads 12 are cylindrical before the etching, each of them has a cone frustum shape after the etching.

Figure 4B:
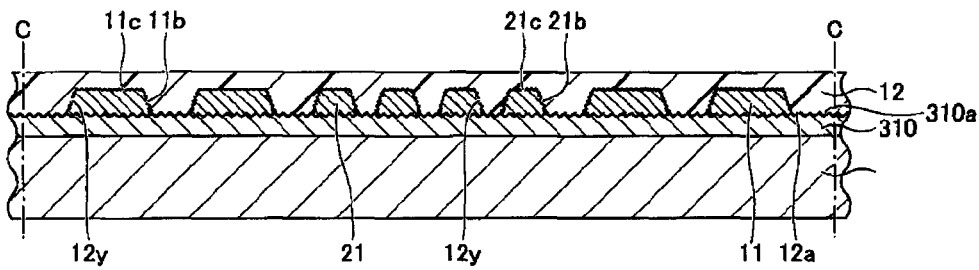

In the subsequent step of FIG. 4B, an insulating layer 12 is formed on the roughened surface 310a of the metal layer 310 so as to cover a part of the first pads 11 (the roughened lower surfaces 11c and the roughened side surfaces 11b), a part of the second pads 21 (the roughened lower surfaces 21c and the roughened side surfaces 21b), and a part of the wiring patterns 22 (not shown; the roughened lower surfaces and roughened side surfaces thereof). As this occurs, the other surface 12a of the insulating layer 12 is formed with recess portions 12y that conform in shape to the first pads 11, the second pads 21, and the wiring patterns 22. For example, the insulating layer 12 may be made of a material containing, as a main component, an insulating resin such as a thermosetting epoxy-based resin. The insulating layer 12 may further contain a filler such as silica ($SiO_2$). The insulating layer 12 may be, for example, about 15 to 35 μm in thickness.

In the case where the insulating layer 12 is made of a film-shaped insulating resin such as a thermosetting epoxy-based resin, the following steps may be performed. That is, the film-shaped insulating resin being in a partially cured state is laminated on the roughened surface 310a of the metal layer 310 so as to cover the first pads 11, the second pads 21, and the wiring patterns 22. The laminated insulating resin is cured by heating it to a temperature higher than its curing temperature while pressing it. Laminating the insulating resin in a vacuum atmosphere can prevent inclusion of voids.

In the case where the insulating layer 12 is made of a thermosetting liquid or paste insulating resin as an epoxy-based resin, the following steps may be performed. That is, the liquid or paste insulating resin is applied to the roughened surface 310a of the metal layer 310 by, for example, spin coating so as to cover the first pads 11, the second pads 21, and the wiring patterns 22. Then, the applied insulating resin is cured by heating it to a temperature higher than its curing temperature.

Figure 4C:
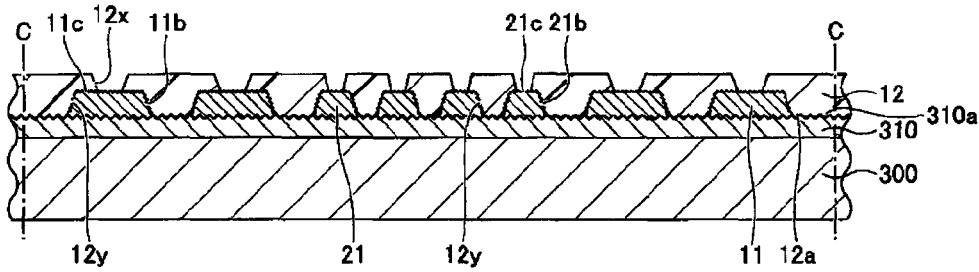

In the subsequent step of FIG. 4C, via holes 12x are formed to pass through the insulating layer 12 and to expose the lower surfaces 11c, 21c of the first and second pads 11, 21. The via holes 12x may be formed, for example, by laser processing using a $CO_2$ laser or the like. Each via hole 12x formed by the laser processing is a recess portion having an inverted cone frustum shape. A diameter of an opening portion of each via hole 12x which opens to the side where the insulating layer 14 is to be formed is larger than a diameter of an opening portion of each via hole 12x which is exposed to the lower surface of the corresponding first or second pad 11, 21. The openings of the via holes 12x through which the lower surfaces 11c of the first pads 11 are exposed may be different in diameter from the openings of the via holes 12x through which the lower surfaces 21c of the second pads 21 are exposed. The same is true on the diameters of the opening portions, which open to the side where the insulating layer 14 is to be formed, of the via holes 12x.

If other via holes are formed by the laser processing, they have a similar shape to the via holes 12x. If the via holes 12x are formed by the laser processing, it is preferable to perform desmearing to remove resin residues of the insulating layer 12 that adhere to the lower surfaces 11c, 21c of the first and second pads 11, 21, which are exposed to the opening portions of the via holes 12x.

Figure 4D:
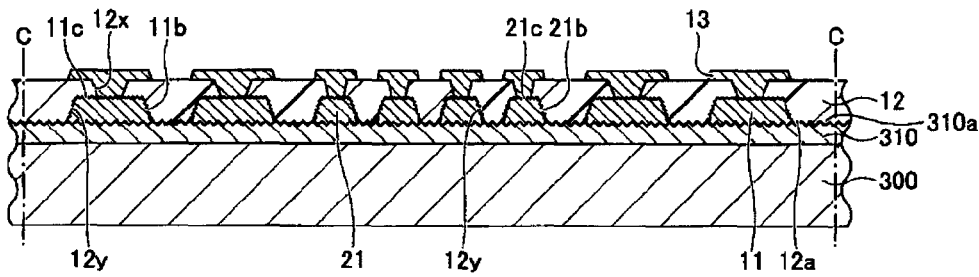

In the subsequent step of FIG. 4D, a wiring layer 13 is formed on the insulating layer 12. The wiring layer 13 includes via wirings and wiring patterns. The via wirings fill the respective via holes 12x. The wiring patterns are formed on the one surface of the insulating layer 12. The wiring layer 13 is electrically connected to the first and second pads 11, 21 which are exposed to the opening portions of the via holes 12x. An material of the wiring layer 13 may be copper (Cu). The wiring layer 13 may be formed by any of various interconnection forming methods such as a semi-additive method and a subtractive method.

Figure 5A:
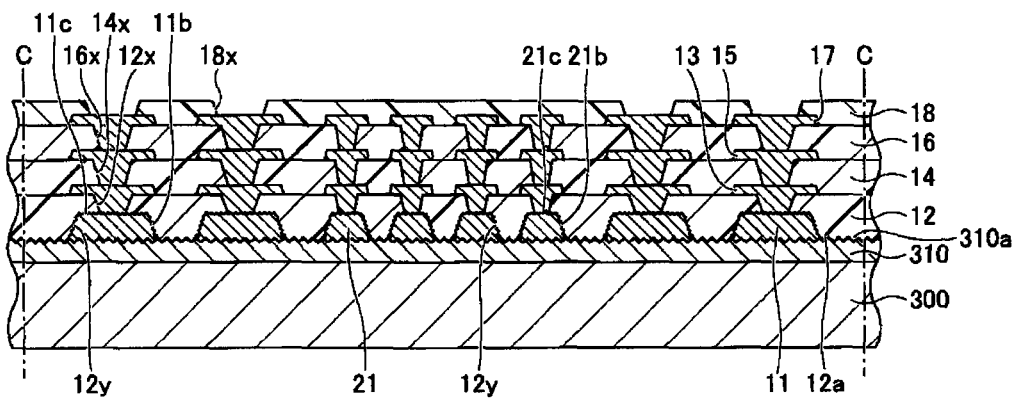
FIGS. 5A to 5C are a third set of section views illustrating the manufacturing process of the wiring substrate according to the first exemplary embodiment.
Figure 6A:
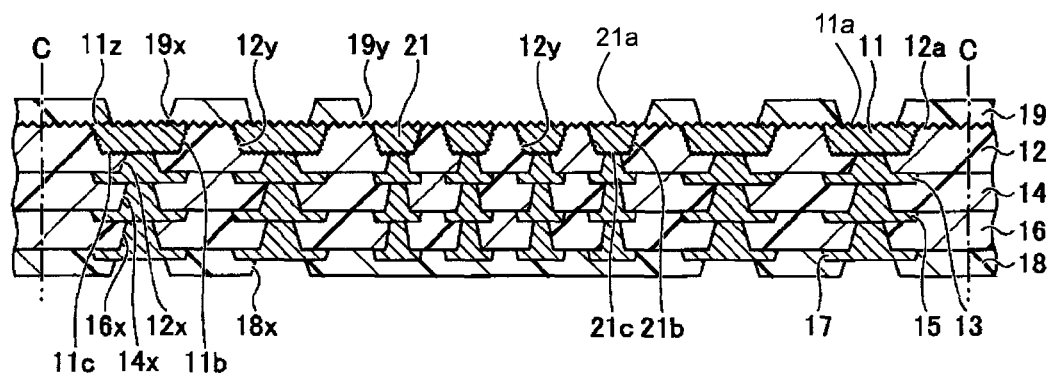
FIGS. 6A and 6B are a fourth set of section views illustrating the manufacturing process of the wiring substrate according to the first exemplary embodiment.
Figure 6B:
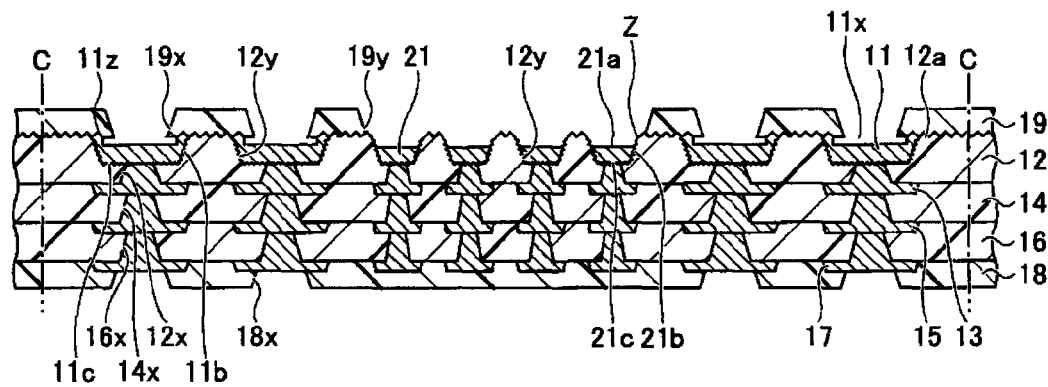

In the subsequent step of FIG. 5A, an insulating layer 14, a wiring layer 15, an insulating layer 16, a wiring layer 17, and a solder resist layer 18 are stacked on one side of the insulating layer 12 by repeatedly performing steps that are the same as or similar to the above-described steps. That is, an insulating layer 14 is formed on the one surface of the insulating layer 12 so as to cover the wiring layer 13. Then, via holes 14x are formed so as to pass through the insulating layer 14 and to expose one surface of the wiring layer 13. The insulating layer 14 may be made of the same insulating resin as the insulating layer 12. The insulating layer 14 may further contain a filler such as silica ($SiO_2$). The insulating layer 14 may be, for example, about 15 to 35 μm in thickness.

A wiring layer 15 is formed on one side of the insulating layer 14 so as to be electrically connected to the wiring layer 13 via the via holes 14x. The wiring layer 15 includes via wirings and wiring patterns. The via wirings fill the via holes 14x. The wiring patterns are formed on the one surface of the insulating layer 14. The wiring layer 15 is electrically connected to the wiring layer 13 which is exposed to opening portions of the via holes 14x. A material of the wiring layer 15 may be copper (Cu). The wiring layer 15 is formed by a semi-additive method, for example. The wiring patterns of the wiring layer 15 may be, for example, about 10 to 20 μm in thickness.

An insulating layer 16 is formed on the one surface of the insulating layer 14 so as to cover the wiring layer 15. Then, via holes 16x are formed so as to pass through the insulating layer 16 and to expose one surface of the wiring layer 15. The insulating layer 16 may be made of the same insulating resin as the insulating layer 12. The insulating layer 16 may contain a filler such as silica ($SiO_2$). The insulating layer 16 may be, for example, about 15 to 35 μm in thickness.

Furthermore, a wiring layer 17 is formed on one side of the insulating layer 16 so as to be electrically connected to the wiring layer 15 via the via holes 16x. The wiring layer 17 includes via wirings and wiring patterns. The via wirings fill the via holes 16x. The wiring patterns are formed on one surface of the insulating layer 16. The wiring layer 17 is electrically connected to the wiring layer 15 which is exposed to opening portions of the via holes 16x. A material of the wiring layer 17 may be copper (Cu). The wiring layer 17 is formed by a semi-additive method, for example. The wiring patterns of the wiring layer 17 may be, for example, about 10 to 20 μm in thickness.

In this manner, the predetermined build-up wiring layers are formed on the one surface of the support body 300. In the exemplary embodiment, the three build-up wiring layers (i.e., wiring layers 13, 15, and 17) are formed. However, n build-up wiring layers may be formed (n is an integer larger than or equal to 1).

Subsequently, a solder resist layer 18 is formed on the one surface of the wiring layer 16 so as to cover the wiring layer 17. For example, the solder resist layer 18 may be formed by applying a photosensitive epoxy-based liquid or paste insulating resin on the one surface of the insulating layer 16 so as to cover the wiring layer 17 by screen printing, roll coating, spin coating, or the like. Alternatively, for example, the solder resist layer 18 may be formed by laminating a film photosensitive epoxy-based insulating resin on the one surface of the insulating layer 16 so as to cover the wiring layer 17.

Then, opening portions 18x are formed by exposing the applied or laminated insulating resin to light and developing the applied or laminated insulating resin (photolithography). The solder resist layer 18 having the opening portions 18x is thus formed. Further alternatively, a film insulating resin which is formed with opening portions 18x in advance may be laminated on the one surface of the insulating layer 16 so as to cover the wiring layer 17. Still further alternatively, the solder resist layer 18 may be made of a non-photosensitive insulating resin. In this case, the solder resist layer 18 is formed on the one surface of the insulating layer 16 and cured. Then, opening portions 18x may be formed by laser processing using a $CO_2$ laser or the like. Alternatively, the opening portions 18x may be formed by blasting using an abrasive such as alumina abrasive grains.

A part of the wiring layer 17 is exposed to inside of the opening portions 18x. The wiring layer 17 exposed to the inside of the opening portions 18x serves as pads to be electrically connected another wiring substrate, a semiconductor package, or the like.

If necessary, metal layers may be formed on the surfaces, exposed to the opening portions 18x, of the wiring layer 17 by electroless plating or the like. The metal layers may be of the same kind as described above. The surfaces, exposed to the opening portions 18x, of the wiring layer 17 may be subjected to anti-oxidation treatment such as OSP treatment.

Figure 5B:
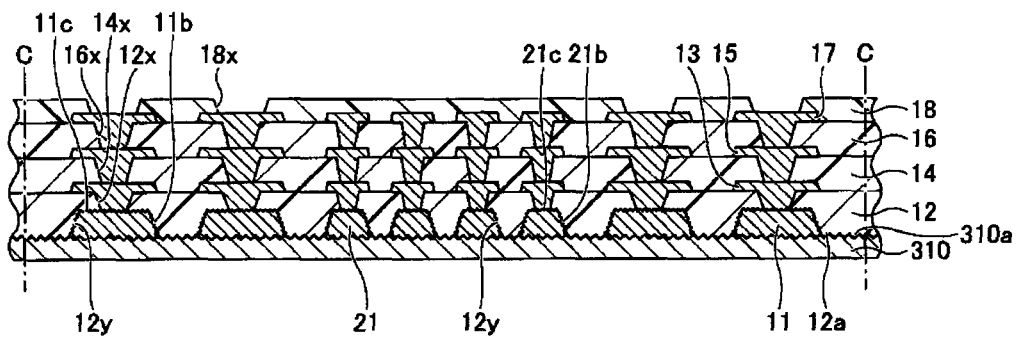

In the subsequent step of FIG. 5B, the support body 300 shown in FIG. 5A is removed. Thereby, the other surface of the metal layer 310 is exposed. The support body 300 which is a copper foil may be removed by, for example, wet etching using a ferric chloride solution, a cupric chloride solution, an ammonium persulfate solution, or the like. The metal layers 310 is made of the metal (e.g., nickel (Ni)) that is not removed by a copper etching solution. Therefore, only the support body 300 (copper foil) can be selectively removed with respect to the metal layers 310. That is, the metal layer 310 serves as an etching stop layer (barrier layer).

Figure 5C:
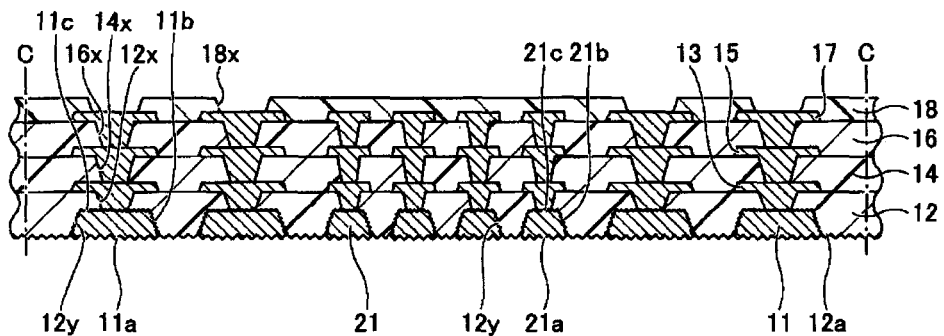

In the subsequent step of FIG. 5C, the metal layer 310 shown in FIG. 5B is removed. If the metal layer 310 is made of, for example, nickel (Ni), the metal layer 310 may be removed by wet etching using a hydrogen peroxide/nitric acid-based solution (i.e., a solution containing hydrogen peroxide and nitric acid), for example. The first pads 11, the second pads 21, and the wiring patterns 22 are made of the metal (e.g., copper (Cu)) that is not removed by a nickel etching solution. Therefore, only the metal layer 310 made of nickel can be removed selectively with respect to the first pads 11, the second pads 21, and the wiring patterns 22. That is, the first pads 11, the second pads 21, and the wiring patterns 22 serve as etching stop layers.

As a result of the removal of the metal layer 310, upper surfaces 11a of the first pads 11, upper surfaces 21a of the second pads 21a, and upper surfaces of the wiring patterns 22 are exposed from the other surface 12a of the insulating layer 12. It is noted that although FIGS. 4A to 5C illustrate that the surfaces 11a of the first pads 11 and the surfaces 21a of the second pads 21 are located on a lower side of the first and second pads 11, 21, the surfaces 11a, 21a will be referred to as "upper surfaces" for the sake of convenience. This is because FIGS. 1, 6A, and 6B illustrate the surfaces 11a, 21a are located on an upper side of the first and second pads 11, 21. The same is true for surfaces of the wiring patterns 22. It is also noted that the upper surfaces 11a of the first pads 11, the upper surfaces 21a of the second pads 21, and the upper surfaces of the wiring patterns 22 are opposite-side surfaces to the lower surfaces 11c of the first pads 11, the lower surfaces 21c of the second pads 21, and the lower surfaces of the wiring patterns 22. The minute asperities of the roughened surface 310a of the metal layers 310 are transferred to the other surface 12a of the insulating layer 12, the upper surfaces 11a of the first pads 11, the upper surfaces 21a of the second pads 21, and the upper surface of the wiring patterns 22. In other words, the minute asperities of the roughened surface 310a of the metal layers 310 are transferred to the surfaces that were in contact with the roughened surfaces 310a of the metal layer 310. For example, the roughness Ra of the other surface 12a of the insulating layer 12, the upper surfaces 11a of the first pads 11, the upper surfaces 21a of the second pads 21, and the upper surfaces of the wiring patterns 22 may be equal to or higher than about 0.3 μm and lower than about 0.5 μm. The other surface 12a of the insulating layer 12 may be substantially flush with the upper surfaces 11a of the first pads 11, the upper surfaces 21a of the second pads 21, and the upper surfaces of the wiring patterns 22.

In the subsequent step of FIG. 6A, a solder resist layer 19 is formed on the other surface (upper surface) 12a of the insulating layer 12 so as to have opening portions 19x and 19y. More specifically, an adjacent portion of the solder resist layer 19 adjacent to a peripheral portion of each opening portion 19x covers an upper peripheral portion 11z of the corresponding first pad 11. Also, each opening portion 19y exposes plural second pads 21. The solder resist layer 19 and its opening portions 19x, 19y may be formed, for example, by the same method as the solder resist layer 18 and its opening portions 18x. It is noted that FIGS. 6A and 6B are inverted from FIGS. 3A to 5C in the top-bottom direction.

As described above, the roughened surface 310a of the metal layer 310 are transferred to the upper surfaces 11a of the first pads 11, the upper surfaces 21a of the second pads 21, and the upper surfaces of the wiring patterns 22. A step for further enhance the roughness of the upper surfaces 11a of the first pads 11, the upper surfaces 21a of the second pads 21, and the upper surfaces of the wiring patterns 22 may be performed before the step of FIG. 6A. For example, the upper surfaces 11a of the first pads 11, the upper surfaces 21a of the second pads 21, and the upper surfaces of the wiring patterns 22 may be etched to thereby further enhance their roughness. The higher roughness provides a higher adhesion property with respect to a target object.

In the subsequent step of FIG. 6B, recess portions 11x and step portions Z are formed as preprocessing for formation of surface treatment layers 20. Specifically, the recess portions 11x are formed in the first pads 11. Also, the step portions Z are formed for the second pads 21 so as to expose inner wall surfaces of the recess portions 12y corresponding to the second pads 21. More specifically, a part of each first pad 11 exposed to the inside of the corresponding opening portion 19x of the solder resist layer 19 is removed, and the recess portion 11x having a smooth bottom surface is formed. The adjacent portion of the solder resist layer 19 adjacent to the peripheral portion of each opening portion 19x protrudes from the upper peripheral portion 11z of the corresponding first pad 11 laterally (in a horizontal direction toward a center portion of the corresponding first pad 11) so as to cover above the recess portion 11x of the corresponding first pad 11. More specifically, the adjacent portion of the solder resist layer 19 adjacent to the peripheral portion of each opening portion 19x protrudes from the upper peripheral portion 11z of the corresponding first pad 11 laterally so as to have an eave shape that covers above the recess portion 11x of the corresponding first pad 11. Also, a part of each second pad 21 exposed to the inside of the corresponding opening portion 19y of the solder resist layer 19 is removed, and the step portion Z which exposes the inner wall surface of the corresponding recess portion 12 is formed. An upper surface 21a of each second pad 21 is a smooth surface. Also, the upper surfaces 21a of the second pads 21 are at a lower level than the other surface (upper surface) 12a of the insulating layer 12. Furthermore, the upper surfaces 21a of the second pads 21 are at the same level as (are flush with) the bottom surfaces of the recess portions 11x.

In this step, an etching solution is selected that does not make the inside of the recess portions 11x and the inside of the recess portions 12y be roughened surfaces. Therefore, the bottom surface and inner wall surface of each recess portion 11x become smooth surfaces rather than roughened surfaces. Also, the upper surface 21a of the second pad 21 which is exposed from each recess portion 12y becomes a smooth surface rather than a roughened surface. For example, the roughness Ra of the bottom surfaces (smooth surfaces) of the recess portions 11x may be equal to or higher than about 0.1 μm and lower than about 0.2 μm. The roughness Ra of the upper surfaces 21a of the second pads 21 may be, for example, equal to or higher than about 0.1 μm and lower than about 0.2 μm. Furthermore, the roughness of the inner wall surfaces of the recess portions 11x may be approximately the same as that of the bottom surfaces of the recess portions 11x.

In the case where the first pads 11 and the second pads 21 are made of copper, an etching solution such as a ferric chloride solution, a cupric chloride solution, or an ammonium persulfate solution of may be selected. The etching proceeds not only vertically but also horizontally. Therefore, an inner wall surface of each recess portion 11x is formed so as to deviate from the inside of the corresponding opening portion 19x to a portion covered by the solder resist layer 19.

That is, in a plan view, each recess portion 11x is formed so that its peripheral portion is located on an outside of the corresponding opening portion 19x. For example, if the opening portion 19x has a circular shape in plan view, a recess portion 11x is formed to have a circular shape in plan view and to be larger in diameter than the opening portion 19x. The etching proceeds approximately at the same rate in the vertical direction and the horizontal direction. Therefore, a width of the portion, covered by the solder resist layer 19, of each recess portion 11x is approximately equal to a depth of the recess portion 11x. For example, the width and depth may be about 2 μm.

After the step of FIG. 6B, the surface treatment layer 20 is formed on the bottom surface and inner wall surface of each recess portion 11x. Also, the surface treatment layer 20 is formed on the upper surface 21a of each second pad 21. Then, the resulting structure is cut at cutting positions C by dicing or the like into individual parts. Thereby, plural wiring substrates 10 (see FIGS. 1A and 1B) are obtained. Metal layers (described above) may be formed as the surface treatment layers 20 by electroless plating or the like. Alternatively, the surface treatment layers 20 may be formed by performing antioxidation treatment such as OSP treatment.

As described above, in the wiring substrate 10 according to the first exemplary embodiment, the bottom surfaces of the recess portions 11x and the upper surfaces 21a of the second pads 21 are the smooth surfaces. Therefore, the upper surfaces of the surface treatment layers 20, which are formed on the bottom surfaces of the recess portions 11x and the upper surfaces 21a of the corresponding second pads 21, are the smooth surfaces. Also, the surface treatment layers 20 are uniform in thickness. As a result, the solder wettability is enhanced, for example, when electrodes of another wiring substrate, a semiconductor package, or a semiconductor chip to the surface treatment layers 20 via solder. Therefore, the reliability of connections between the wiring substrate 10 and the semiconductor chip or the like can be enhanced.

Also, the surfaces (the lower surfaces 11c, 21c and the side surfaces 11b, 21b), being in contact with the insulating layer 12, of the first and second pads 11, 12 and the surfaces (lower surfaces and side surfaces), being in contact with the insulating layer 12, of the wiring patterns 22 are roughened surfaces. Therefore, they produce an anchor effect. As a result, the adhesion property between (i) the first pads 11, the second pads 21, the wiring patterns 22 and (ii) the insulating layer 12 can be enhanced. Also, peeling off or a crack between the insulating layer 12 and the wiring layer 13 due to stress can be prevented.

Also, the surfaces, being in contact with the insulating layer 12, of the first and second pads 11, 12 and the surfaces, being in contact with the insulating layer 12, of the wiring patterns 22 are lower in roughness than the upper surface 12a of the insulating layer 12 and the upper peripheral portions 11z of the first pads 11. This prevents the first pads 11, the second pads 21, and the wiring patterns 22 from becoming too narrow and ensures a transmission reliability. For example, the high-frequency characteristics can be enhanced.

The solder resist layer 19 covers the upper peripheral portions 11z of the first pads 11. Therefore, the first pads 11 can be prevented from coming off due to stress that occurs when another wiring substrate, a semiconductor package, or the like is mounted.

Also, the solder resist layer 19 protrudes to have the eave shapes that cover above the recess portions 11x. Therefore, when solder or the like is formed in the recess portions 11x in mounting another wiring substrate, a semiconductor package, or the like, the eave-shape protrusion portions of the solder resist layer 19 function as wedges to prevent coming-off of solder or the like.

Also, the upper peripheral portions 11z of the first pads 11 are the roughened surfaces. Therefore, the upper peripheral portions 11z of the first pads 11 provide an anchor effect. As a result, the adhesion property between the first pads 11 and the solder resist layer 19 can be enhanced.

Also, the upper surface 12a of the insulating layer 12 is the roughened surface. Therefore, the upper surface 12a of the insulating layer 12 provides the anchor effect. As a result, the adhesion property between the insulating layer 12 and the solder resist layer 19 can be enhanced.

Also, the solder resist layers 18 and 19 are formed on the both sides of the wiring substrate 10. Therefore, the wiring substrate 10 is higher in rigidity than build-up boards of related art in which a solder resist layer is formed only on a single side. As a result, peeling off, a crack, or the like can be prevented from occurring at the boundary between the insulating layer and the wiring layer.

Also, the solder resist layers 18 and 19 are formed on the both sides of the wiring substrate 10. Therefore, the uniformity of the thermal expansion coefficient in the top-bottom direction (thickness direction) is enhanced. Thereby, the degree of a warp of the wiring substrate 10 due to a thermal history it has experienced can be lowered.

<First Modification of First Exemplary Embodiment>

A first modification of the first exemplary embodiment relates to a wiring substrate that is different in form from the wiring substrate 10. In the first modification of the first exemplary embodiment, descriptions on constituent members that are the same as those of the above-described first exemplary embodiment will be omitted.

Figure 7A:
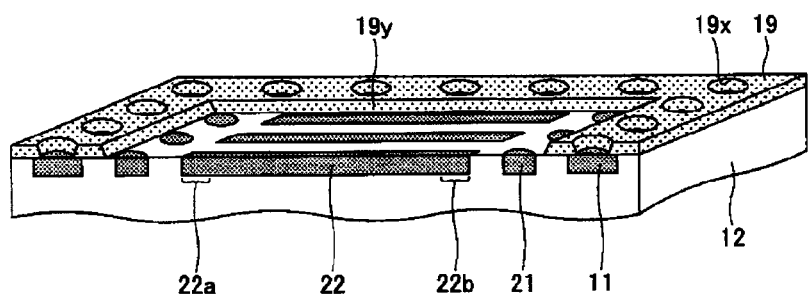
FIGS. 7A to 7C are perspective views of a part of the wiring substrate according to a first modification of the first exemplary embodiment.
Figure 7B:
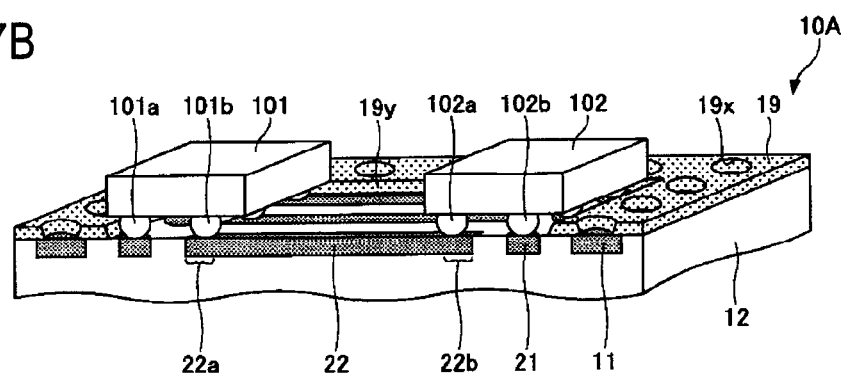
Figure 7C:
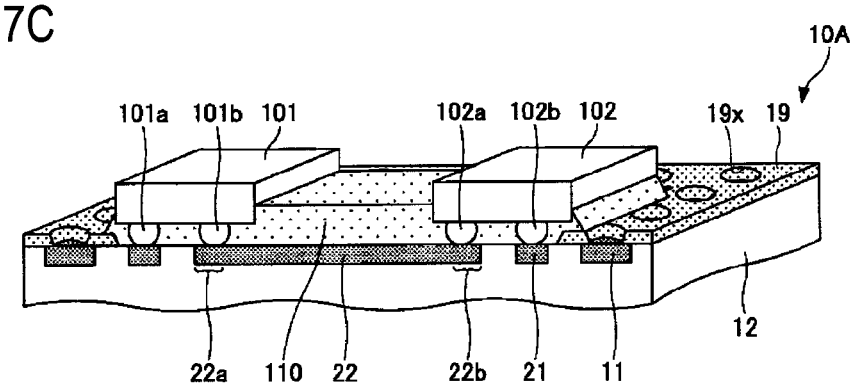

FIGS. 7A to 7C are perspective views of a part of a wiring substrate 10A according to the first modification of the first exemplary embodiment. More specifically, FIG. 7A shows a part of the wiring substrate 10A itself. FIGS. 7B and 7C show states where semiconductor chips 101 and 102 are mounted on the wiring substrate 10A.

Referring to FIG. 7A, the wiring substrate 10A is different from the wiring substrate 10 (see FIGS. 1A and 1B) in that not only the second pads 21 but also the wiring patterns 22 are exposed through an opening portion 19y of a solder resist layer 19. First end portions 22a and second end portions 22b of the wiring patterns 22 function as pads to be connected to bumps of a semiconductor chip. Therefore, the first end portions 22a and the second end portions 22b of the wiring patterns 22 may also be referred to as "second pads."

The upper surfaces of the second pads 21 and the upper surfaces of the wiring patterns 22 including the first and second end portions 22a, 22b are smooth surfaces. The roughness Ra thereof may be, for example, equal to or higher than about 0.1 μm and lower than about 0.2 μm.

The wiring substrate 10A is configured in the same manner as the wiring substrate 10 shown in FIGS. 1A and 1B except for the structure shown in FIG. 7A which involves the first pads 11, the insulating layer 12, the solder resist layer 19, the second pads 21, and the wiring patterns 22. Also, the recess portions 11x and the step portions Z (which are shown in FIGS. 1A and 1B) are omitted in FIG. 7A. However, recess portions 11x are formed in the first pads 11 of the wiring substrate 10A similarly to FIGS. 1A and 1B. Also, step portions Z are formed in the second pad 21 and wiring patterns 22 of the wiring substrate 10A similarly to FIGS. 1A and 1B.

FIG. 7B shows a state that semiconductor chips 101 and 102 are mounted on the wiring substrate 10A. The semiconductor chip 101 has bumps 101b (e.g., solder bumps) in a row that is located on a side facing the semiconductor chip 102 and bumps 101a (e.g., solder bumps) in a row that is located on an opposite side to the facing side. The bumps 101a of the semiconductor chip 101 are connected to the second pads 21. The bumps 101b of the semiconductor chip 101 are connected to the first end portions 22a of the wiring patterns 22.

The semiconductor chip 102 has bumps 102a (e.g., solder bumps) in a row that is located on a side facing the semiconductor chip 101 and bumps 102b (e.g., solder bumps) in a row that is located on an opposite side to the facing side. The bumps 102a of the semiconductor chip 102 are connected to the second end portions 22a of the wiring patterns 22. The bumps 102b of the semiconductor chip 102 are connected to the second pads 21.

As shown in FIG. 7C, an underfill resin 110 may be formed on the wiring substrate 10A so as to cover the bumps 101a, 101b of the semiconductor chip 101 and the bumps 102a, 102b of the semiconductor chip 102.

In this manner, the opening portion 19y may be formed in the solder resist layer 19 so as to expose the second pads 21 and the wiring patterns 22. Also, the first and second end portions 22a, 22b of the wiring patterns 22 and the second pads 21 may be used as pads for connection to bumps of semiconductor chips.

The first and second end portions 22a, 22b of the wiring patterns 22 may have, for example, a circular shape in plan view.

<Second Modification of First Exemplary Embodiment>

A second modification of the first exemplary embodiment relates to a manufacturing process that is different from the process for manufacturing the wiring substrate 10 in that another support body is used in place of the support body 300. In the second modification of the first exemplary embodiment, descriptions on constituent members that are the same as those of the above-described first exemplary embodiment will be omitted.

Figure 8A:
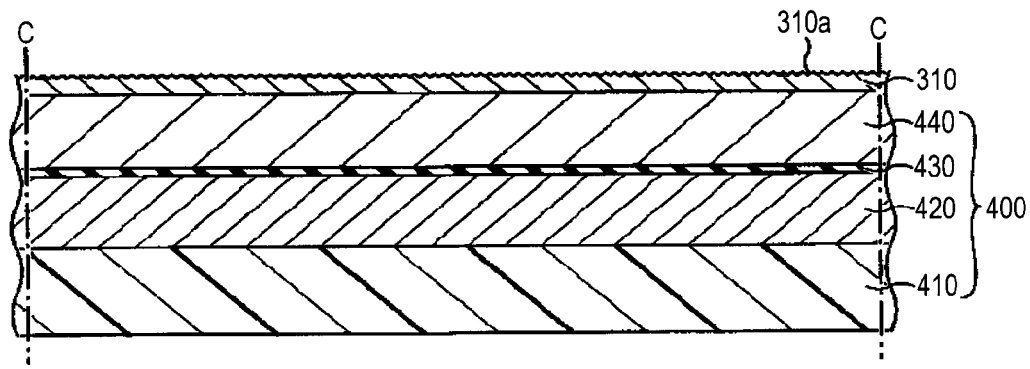
FIGS. 8A to 8C are section views illustrating a manufacturing process of a wiring substrate according to a second modification of the first exemplary embodiment.
Figure 8B:
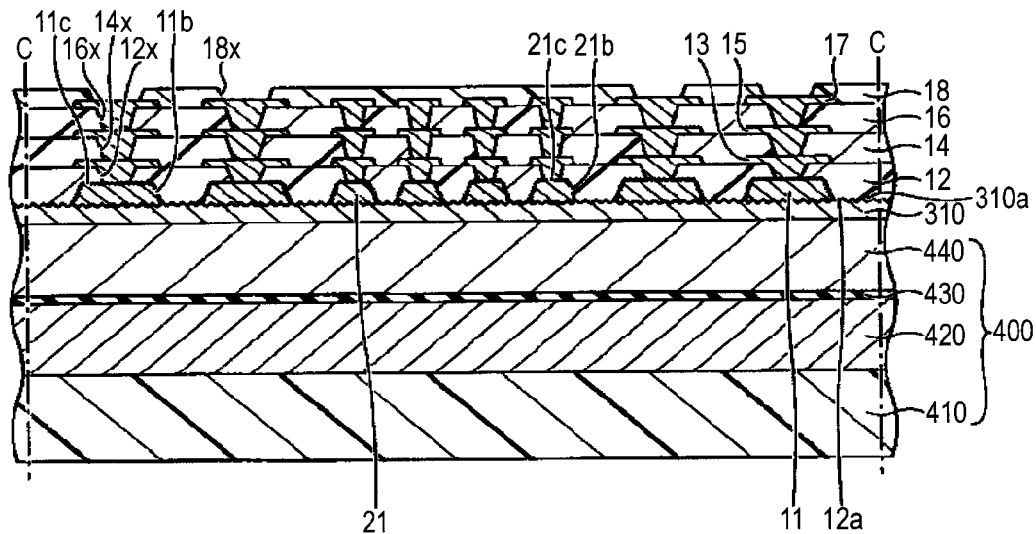
Figure 8C:
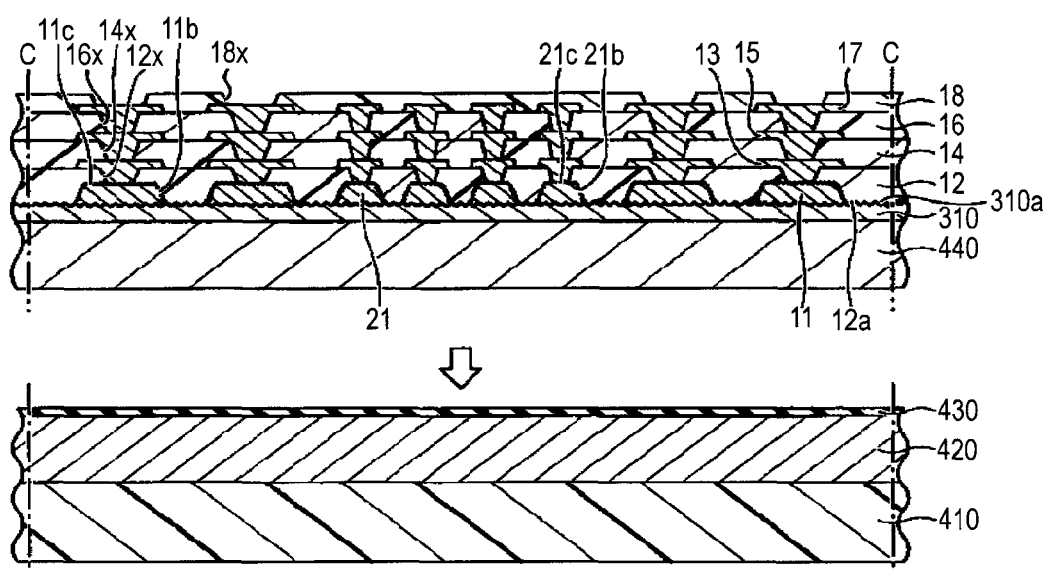

FIGS. 8A to 8C illustrate processes for manufacturing a wiring substrate according to the second modification of the first exemplary embodiment.

In a step of FIG. 8A, a support body 400 is prepared. A metal layer 310 is formed on the support body 400. One surface 310a of the metal layer 310 is a roughened surface. The support body 400 has such a structure that a metal foil 420, a peeling layer 430, and a metal foil 440 are stacked on an insulating layer 410 in this order. The insulating layer 410 may be, for example, a layer obtained by impregnating such a resin as an epoxy-based resin in glass cloth (woven fabric), glass nonwoven fabric, aramid fiber, or the like. The insulating layer 410 may be, for example, about 0.3 to 0.5 mm in thickness. The metal foil 420 may be, for example, a copper foil. The metal foil 420 may be, for example, about 2 to 5 μm in thickness. A lower surface (i.e., the surface in contact with the insulating layer 410) of the metal foil 420 is a roughened surface. The roughness Ra of the lower surface of the metal foil 420 may be, for example, equal to or higher than about 0.3 μm and lower than about 0.5 μm. The roughened lower surface of the metal foil 420 provides an adhesion property between the metal foil 420 and the insulating layer 410.

It is preferable that the peeling layer 430 be made of an organic material or an inorganic material. The organic material may be a fluororesin (e.g., ETFE). In this case, for example, the peeling layer 430 may be formed by stacking a fluororesin (e.g., ETFE) on the upper surface of the metal foil 420. Alternatively, the organic material may be a silicone resin. Also, the inorganic material may a nickel-based single layer, or chromium-based single layer or alloy layer.

The metal foil 440 may be, for example, a copper foil. The metal foil 440 may be, for example, about 15 to 20 μm in thickness. The upper surface (i.e., the surface opposite to the surface in contact with the peeling layer 430) is made a mirror surface. Here, the "mirror surface" means a surface whose roughness Ra is lower than 0.1 μm.

In the support body 400, the peeling layer 430 and the metal foil 440 are tentatively bonded to each other so that the peeling layer 430 and the metal foil 440 can be peeled off each other. The peeling layer 430 and the metal foil 420 are bonded to each other relatively strongly. The term "tentative bonding" means bonding with such a bonding strength that members concerned are not bonded to each other strongly and can be peeled off each other easily by applying mechanical force to them. It is preferable that the peel strength of the bonding between the peeling layer 430 and the metal foil 440 be in a range of about 5 to 600 g/cm. It is further preferable that the peel strength be in a range of about 30 to 400 g/cm. These peel strength ranges are such that the peeling layer 430 and the metal foil 440 can be peeled off each other easily in a step of removing the support body 400 and that they are not peeled off each other in other steps, that is, when the peeling there is not intended.

To manufacture the support body 400, at first, a B-stage (partially cured) prepreg is prepared in which a resin such as an epoxy-based resin is impregnated in glass cloth (woven fabric), glass nonwoven fabric, aramid fiber, or the like.

Subsequently, the metal foil 420 having (i) a lower surface which is the roughened surface and (ii) an upper surface on which the peeling layer 430 is formed is prepared. The metal foil 420 is stacked on the prepreg with the lower surface of the metal foil 420 facing the prepreg. Then, the metal foil 440 whose upper surface is a mirror surface is prepared. The metal foil 440 is stacked on the peeling layer 430 with the lower surface of the metal foil 440 facing the peeling layer 430. Then, the resulting structure in which the members 420 to 440 are stacked on the prepreg is, for example, pressed from the metal foil 440 side toward the prepreg side in a vacuum atmosphere at about 190° C. to 200° C. (heat pressing step). As a result, the prepreg is cured to become the insulating layer 410, and the support body 400 is obtained.

The upper surface of the metal foil 440 may be made a mirror surface by, for example, performing processing such as buff polishing or chemical etching to the upper surface of the metal foil 440. Alternatively, if a surface, opposite to a surface in contact with a drum, of an electrolytic copper foil is a mirror surface, the electrolytic copper foil may be used as the metal foil 440 as it is. Further alternatively, if at least one surface of a rolled copper foil is a mirror surface, the rolled copper foil may be used as the metal foil 440 as it is.

Subsequently, in the same manner as in the step of FIG. 3A, a metal layer 310 having a roughened surface 310a is formed on the upper surface (mirror surface) of the metal foil 440. If the upper surface of the metal foil 440 were not to be a mirror surface, the roughness of the roughened surface 310a of the metal layer 310 formed on the upper surface of the metal foil 440 might vary widely. For example, even if a target range of the roughness Ra of the roughened surface 310a is equal to or higher than about 0.3 μm and lower than about 0.5 μm, the roughness Ra in the target range might not be achieved but might exceed the target range.

Assuming arguendo that the roughness of the roughened surface 310a varies widely. In this case, for example when a resist layer 320 is formed on the roughened surface 310a, the strength of an adhesion property between the roughened surface 310a and the resist layer 320 becomes not uniform, that is, becomes insufficient at some positions. Then, a portion of the resist layer 320 might be lost at such positions. Also, if an end portion of a wiring pattern is formed on a high-roughness portion of the roughened surface 310a, the linearity of the wiring pattern may be lowered. Any of these phenomena may cause trouble in forming, for example, narrow-pitch wiring patterns (fine patterns).

In contrast, in the support body 400, the upper surface of the metal foil 440 is the mirror surface. Therefore, the roughness of the roughened surface 310a does not vary largely. For example, if a target range of roughness Ra of the roughened surface 310a is higher than or equal to about 0.3 μm and lower than about 0.5 μm, it can be easily achieved. As a result, for example, when the resist layer 320 is formed on the roughened surface 310a, the strength of adhesion property between the roughened surface 310a and the resist layer 320 becomes uniform. Therefore, the probability that a portion of the resist layer 320 is lost is low. The linearity of wiring patterns formed can be made high. This makes it possible to keep high yields in forming, for example, narrow-pitch wiring patterns (fine patterns).

In a step of FIG. 8B which follows the step of FIG. 8A, the same steps as illustrated by FIGS. 3B to 5A (first exemplary embodiment) are performed. As a result, first pads 11, second pads 21, and wiring patterns 22 are formed on the support body 400 via the metal layer 310. Furthermore, an insulating layer 12, a wiring layer 13, an insulating layer 14, a wiring layer 15, an insulating layer 16, a wiring layer 17, and a solder resist layer 18 (having opening portions 18x) are stacked one on another.

In the subsequent step of FIG. 8C, a part of the support body 400 is removed. More specifically, the peeling layer 430 is peeled off the metal foil 440 at their interface. Thereby, the stacked structure consisting of the insulating layer 410, the metal foil 420, and the peeling layer 430 is removed. As mentioned above, the peeling layer 430 and the metal foil 440 are bonded to each other tentatively in a peelable manner. Therefore, the peeling layer 430 and the metal foil 440 can be peeled off each other. Then, the same steps as illustrated by FIGS. 5B and 5C (first exemplary embodiment) are performed. Thereby, the metal foil 440 and the metal layer 310 are removed. As a result, the support body 400 is removed completely.

Subsequently, the same steps as illustrated by FIGS. 6A and 6B (first exemplary embodiment) are performed. Surface treatment layers 20 are then formed on the bottom surfaces and inner wall surfaces of the recess portions 11x. Also, surface treatment layers 20 are formed on the upper surfaces 21a of the second pads 21. The resulting structure is cut at cutting positions C by dicing or the like into individual parts. Thereby, plural wiring substrates 10 (see FIGS. 1A and 1B) are obtained.

As described above, in the process for manufacturing the wiring substrate 10 according to the second modification of the first exemplary embodiment, the metal layer 310 is formed on the mirror surface of the metal foil 440 which constitutes the support body 400. Therefore, the roughness of the roughened surface 310a can be controlled to a desired value. As a result, for example, when the resist layer 320 is formed on the roughened surface 310a, the strength of the adhesion property between the roughened surface 310a and the resist layer 320 becomes uniform. Therefore, the probability that a portion of the resist layer 320 is lost is low. The linearity of wiring patterns formed can be made high. This makes it possible to keep high yields in forming, for example, narrow-pitch wiring patterns (fine patterns).

The support body 400 is a structure in which the plural members are stacked. Therefore, the support body 400 is stronger than the support body 300 used in the first exemplary embodiment which is a single copper foil. Hence, the support body 400 can be handled easily during the manufacturing process. However, where it is not necessary to use s strong support body, the same advantages as mentioned above can be obtained by making the one surface of the support body 300 (single copper foil) a roughened surface and forming the metal layer 310 on the mirror surface.

Furthermore, when it is desired to stack insulating layers and wiring layers on both surfaces of a support body with a metal layer 310 interposed in between, such a support body may be used in which metal foils 420, the peeling layers 430, and the metal foils 440 are stacked on the insulating layer 410 in a top/bottom-symmetrical manner. Metal layers 310 can be formed (followed by stacking of insulating layers and wiring layers) on each of the mirror surfaces, exposed on the upper side and the lower side of the support body, of the respective metal foils 440. Subsequently, the peeling layer 430 and the metal foil 440 are peeled off each other at their interface on each of the upper side and the lower side of the insulating layer 410. Thereby, the stacked structure consisting of the insulating layer 410, the metal foils 420, and the peeling layers 430 is removed. As a result, two structures each being the same as shown in the top part of FIG. 8C are manufactured. That is, wiring substrates 10 can be manufactured by basically the same process as described above.

<Third Modification of First Exemplary Embodiment>

A third modification of the first exemplary embodiment relates to still another support body that can be used in the processes for manufacturing the wiring substrate 10. In the third modification of the first exemplary embodiment, descriptions on constituent members which are the same as those of the first exemplary embodiment or those of the above described modifications will be omitted.

Figure 9A:
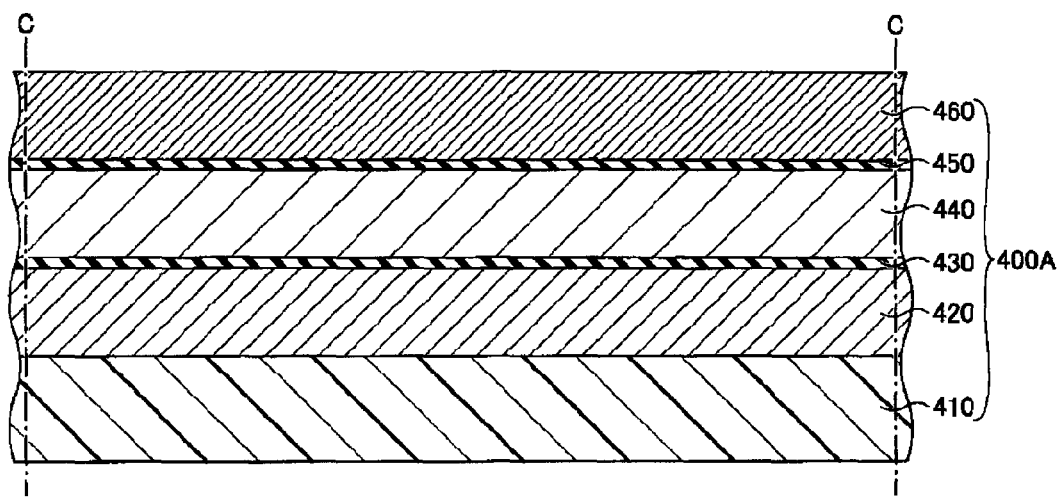
FIGS. 9A to 9C are section views showing the structures of other support bodies.

FIG. 9A shows the structure of still another support body 400A. In the second modification of the first exemplary embodiment, the support body 400A shown in FIG. 9A may be used in place of the support body 400. The support body 400A has such a structure that a peeling layer 450 and a protective metal foil 460 are stacked on the upper surface of the metal foil 440 of the support body 400. In the support body 400A, the peeling layer 450 and the metal foil 440 are bonded to each other tentatively in a peelable manner. Also, the peeling layer 450 and the protective metal foil 460 are bonded to each other relatively strongly. Also, the peel strength of the bonding between the peeling layer 450 and the metal foil 440 is lower than that of the bonding between the peeling layer 430 and the metal foil 440. The protective metal foil 460 may be, for example, a copper foil. The protective metal foil 460 may be, for example, in a range of about 2 to 12 μm in thickness. For example, the material and thickness of the peeling layer 450 may be the same as those of the peeling layer 430.

To use the support body 400A, at first, the peeling layer 450 and the metal foil 440 are peeled off each other at their interface, to thereby remove the stacked structure consisting of the peeling layer 450 and the protective metal foil 460. This step renders the support body 400A have the same structure as the support body 400. Therefore, after this step, the support body 400A can be used in the same manner as the support body 400. As mentioned above, the peel strength of the bonding between the peeling layer 450 and the metal foil 440 is lower than that of the bonding between the peeling layer 430 and the metal foil 440. Therefore, the peeling layer 450 and the metal foil 440 can be peeled off each other easily by applying mechanical force to them while the tentative bonding between the peeling layer 430 and the metal foil 440 is maintained. That is, the stacked body consisting of the peeling layer 450 and the protective metal foil 460 can be removed easily without peeling the peeling layer 430 and the metal foil 440 off each other.

The peeling layer 450 and the protective metal foil 460 are stacked on the mirror surface of the metal foil 440 in the above described manner. Thereby, the mirror surface of the metal foil 440 can be protected during manufacture of the support body 400A and from manufacture of the support body 400A to immediately before its use. More specifically, for example, sticking of foreign substances to the mirror surface of the metal foil 440 can be prevented.

<Fourth Modification of First Exemplary Embodiment>

A fourth modification of the first exemplary embodiment relates to yet another support body that can be used in the processes for manufacturing the wiring substrate 10. In the fourth modification of the first exemplary embodiment, descriptions on constituent members which are the same as those of the first exemplary embodiment or those of the above described modifications will be omitted.

Figure 9B:
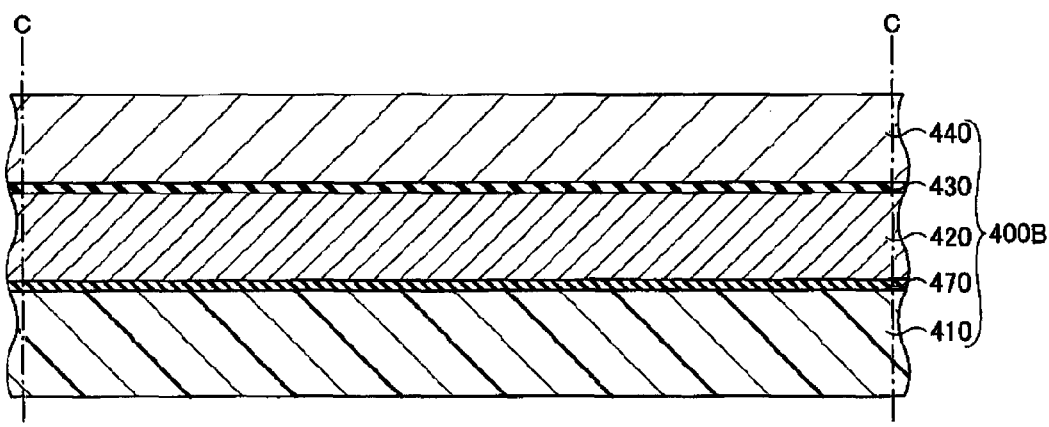

FIG. 9B shows the structure of yet another support body 400B. In the second modification of the first exemplary embodiment, the support body 400B may be used in place of the support body 400. The support body 400B has such a structure that an adhesion layer 470 is interposed between the insulating layer 410 and the metal foil 420 of the support body 400. A material of the adhesion layer 470 may be, for example, an epoxy-based resin.

In the second modification of the first exemplary embodiment, adhesion property between the insulating layer 410 and the metal foil 420 is secured by roughening the lower surface of the metal foil 420. In contrast, in the fourth modification of the first exemplary embodiment, the adhesion layer 470 is interposed between the insulating layer 410 and the metal foil 420. Therefore, the adhesion property between the insulating layer 410 and the metal foil 420 can be secured without roughening of the lower surface of the metal foil 420.

As described above, the adhesion property between the insulating layer 410 and the metal foil 420 may be secured by interposing the adhesion layer 470 therebetween.

<Fifth Modification of First Exemplary Embodiment>

A fifth modification of the first exemplary embodiment relates to a further another support body that can be used in the processes for manufacturing the wiring substrate 10. In the fifth modification of the first exemplary embodiment, descriptions on constituent members which are the same as those of the first exemplary embodiment or those of the above described modifications will be omitted.

Figure 9C:
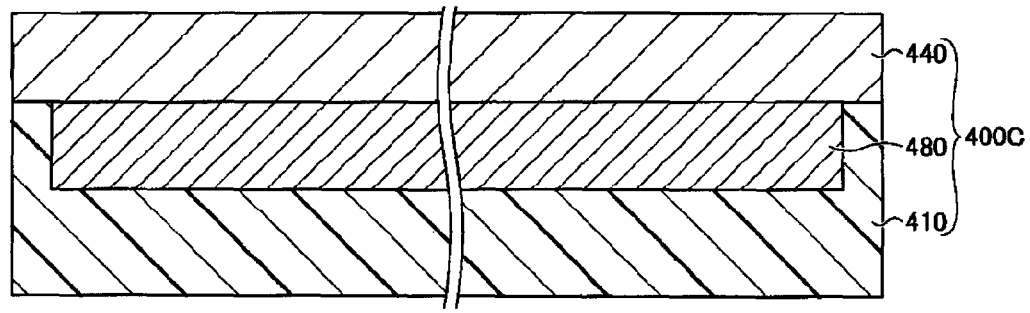

FIG. 9C shows the structure of a further another support body 400C. The support body 400C has the following structure. That is, a metal foil 480 (e.g., copper foil) having a smaller shape in plan view than the metal foil 440 is placed on the lower surface (i.e., the surface opposite to the mirror surface) of the metal foil 440. Also, an insulating layer 410 is provided on the lower surface of the metal foil 440 so as to cover the side surfaces and lower surface of the metal foil 480. For example, where the metal foil 440 is rectangular, the metal foil 480 is prepared that has a smaller rectangular shape in plan view than the metal foil 440. The metal foil 480 is then placed on the lower surface of the metal foil 440 so that a peripheral portion of the lower surface of the metal foil 440 is exposed. Subsequently, the insulating layer 410 is placed on the lower surface of the metal foil 440 so as to cover the side surfaces and lower surface of the metal foil 480. The insulating layer 410 is bonded to the peripheral portion of the lower surface of the metal foil 440. While the insulating layer 410 is bonded to the side surfaces and lower surface of the metal foil 480, the metal foils 440 and 480 are not bonded to each other but are merely in contact with each other.

To use the support body 400C in the processes for manufacturing the wiring substrate 10, at first, in the same manner as in the second modification of the first exemplary embodiment, a metal layer 310 having a roughened surface 310a is formed on the upper surface (mirror surface) of the metal foil 440. Subsequently, the same steps as illustrated by FIGS. 3B to 5A (first exemplary embodiment) are performed. As a result, first pads 11, second pads 21, and wiring patterns 22 are formed on the support body 400C through the metal layer 310. Furthermore, an insulating layer 12, a wiring layer 13, an insulating layer 14, a wiring layer 15, an insulating layer 16, a wiring layer 17, and a solder resist layer 18 (having opening portions 18x) are stacked one another (see the upper part of FIG. 10).

Figure 10:
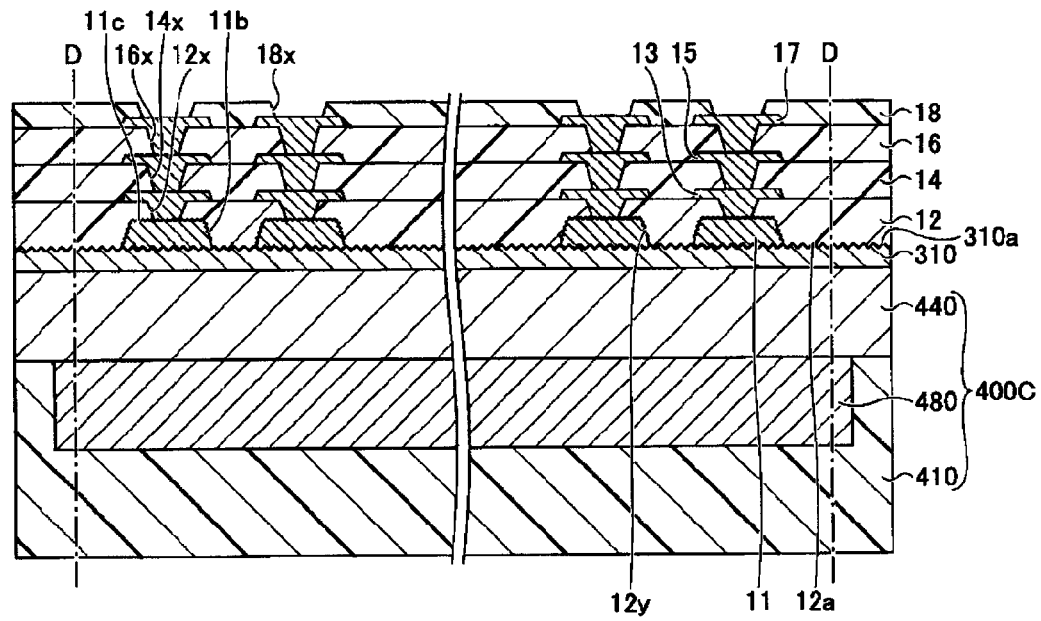
FIG. 10 is section views illustrating a manufacturing process of a wiring substrate according to a fifth modification of the first exemplary embodiment.
Figure 10:
Figure 10:
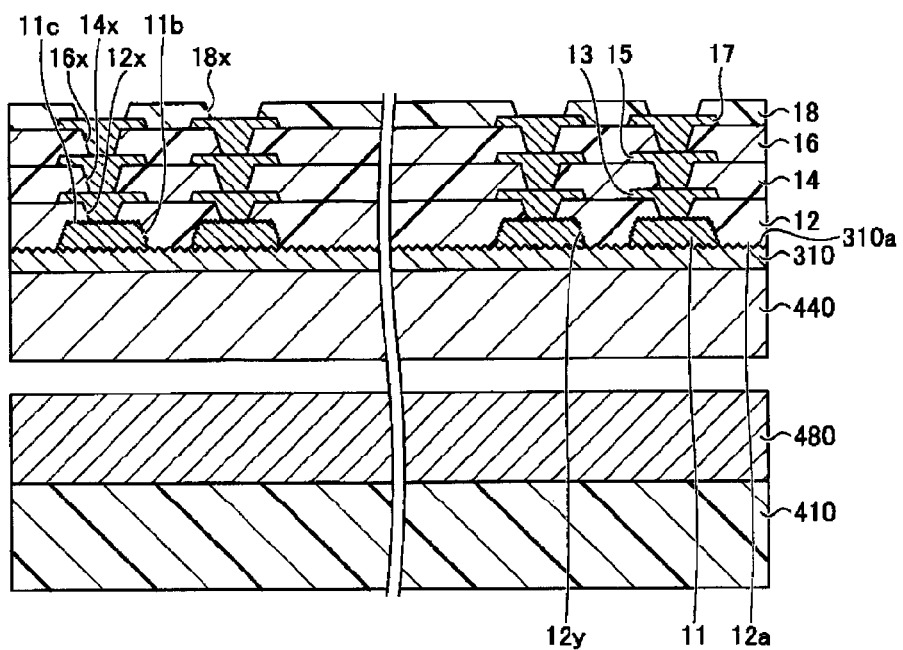

Then, the structure body shown in the upper part of FIG. 10 is cut at cutting positions D. For example, where the metal foil 480 is rectangular, the cutting positions D are set at such plan-view positions that a peripheral portion of the metal foil 480 will be cut away. As a result, the portion where the metal foil 440 and the insulating layer 410 are bonded to each other is removed. Thereby, the metal foils 440 and 480 which have been merely in contact with each other are also separated from each other (see the lower part of FIG. 10). That is, the stacked structure consisting of the insulating layer 410 and the metal foil 480 is removed.

Subsequently, the same steps as illustrated by FIGS. 5B to 6B (first exemplary embodiment) are performed. Surface treatment layers 20 are then formed on the bottom surfaces and inner wall surfaces of the recess portions 11x. Also, surface treatment layers 20 are formed on the upper surfaces 21a of the second pads 21. Then, the resultant structure is cut at cutting positions C by dicing or the like into individual parts. Thereby, plural wiring substrates 10 (see FIGS. 1A and 1B) are achieved.

As described above, the support body 400C may be used, having such a structure that the metal foils 440 and 480 are separated from each other by cutting away a peripheral portion.

<Second Exemplary Embodiment>

A second exemplary embodiment relates to another wiring substrate which is different from the wiring substrate 10. In the second exemplary embodiment, descriptions on constituent members which are the same as those of the first exemplary embodiment or those of the modifications of the first exemplary embodiment will be omitted.

[Structure of Wiring Substrate According to Second Exemplary Embodiment]

Figure 11A:
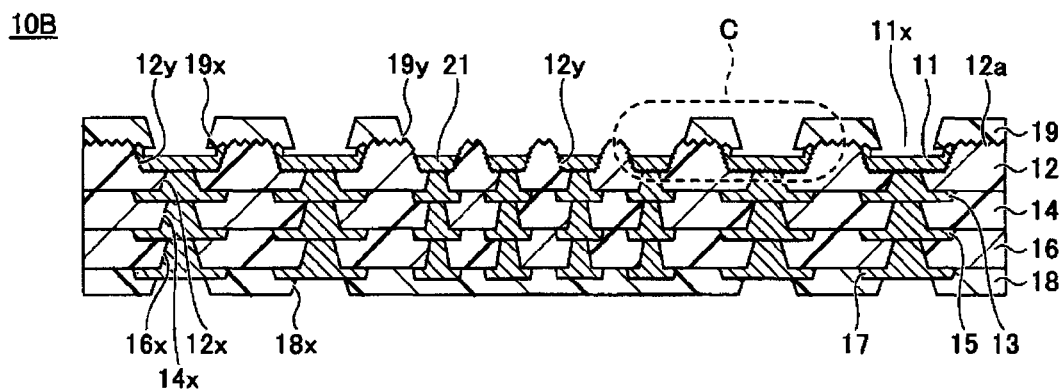
FIGS. 11A and 11B are section views illustrating a wiring substrate according to a second exemplary embodiment.
Figure 11B:
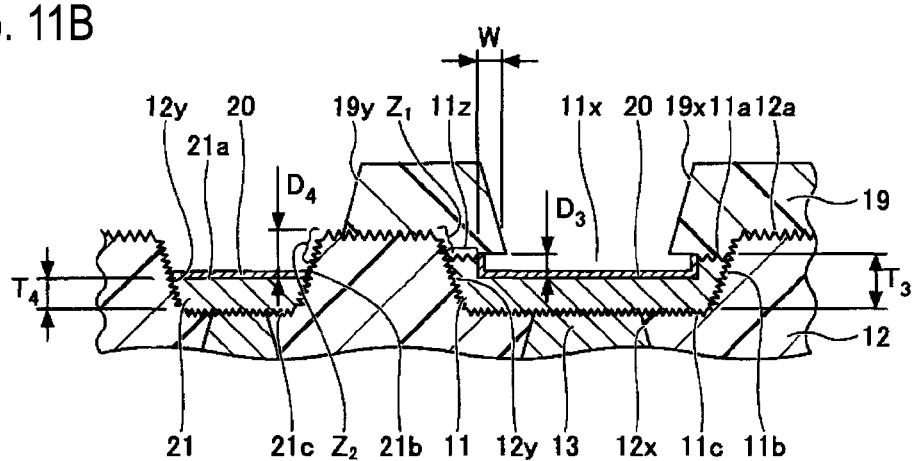

Firstly, the structure of a wiring substrate according to the second exemplary embodiment will be described. FIGS. 11A and 11B are section views illustrating the wiring substrate 10B according to the second exemplary embodiment. FIG. 11A is a section view corresponding to FIG. 1A. FIG. 11B is an enlarged partial section view illustrating a part C in FIG. 11A. It is noted that in FIG. 11A, the surface treatment layers are not shown. Also, a plan view of the wiring substrate 10B according to the second exemplary embodiment may be similar to, for example, FIG. 2.

Referring to FIG. 11B, in the wiring substrate 10B, the upper surface 11a of each first pad 11 is at a lower level than the upper surface 12a of the insulating layer 12. Therefore, a step portion $Z_1$ is provided between the upper surface 11a of each first pad 11 and the upper surface 12a of the insulating layer 12. In each step portion $Z_1$, the inner wall surface of the corresponding recess portion 12y is exposed. Each step portion $Z_1$ may have, for example, about 2 μm in depth.

Similarly to the wiring substrate 10, the recess portion 11x having the smooth bottom surface and smooth inner wall surface is formed in the center portion of each first pad 11 (in portions excluding the upper peripheral portion 11z of each first pad 11). The roughness Ra of the bottom surface (smooth surface) of each recess portion 11x may be, for example, equal to or higher than about 0.1 μm and lower than about 0.2 μm. Also, the roughness of the inner wall surface of each recess portion 11x may be substantially the same as that of the bottom surface of each recess portion 11x. The thickness $T_3$ of each first pad 11 from its upper surface 11a may be, for example, in a range of about 1 to 2 μm.

In the wiring substrate 10, the roughness of the upper peripheral portion 11z of each first pad 11 is substantially the same as that of the upper surface 12a of the insulating layer 12 (for example, about 0.3 μm≤Ra<about 0.5 μm). On the other hand, in the wiring substrate 10B, the roughness of the upper peripheral portion 11z of each first pad 11 is smaller than that of the upper surface 12a of the insulating layer 12 (for example, about 0.3 μm≤the roughness Ra of the upper surface 12a of the insulating layer 12<about 0.5 μm). The roughness of the upper peripheral portion 11z of each first pad 11 (the roughness of the upper surface 11a of each first pad 11) may be, for example, substantially the same as that of the lower surface 11c of each first pad 11. Specifically, 0.2 μm≤the roughness Ra of the upper peripheral portion 11z of each first pad 11<0.3 μm.

The upper surface 21a of each second pad 21 is at a lower level than the upper surface 12a of the insulating layer 12. Therefore, a step portion $Z_2$ is provided between the upper surface 21a of each first pad 21 and the upper surface 12a of the insulating layer 12. In each step portion $Z_2$, the inner wall surface of the corresponding recess portion 12y is exposed. The step portions $Z_2$ are larger in depth than the step portions $Z_1$. The step portions $Z_2$ are also roughened surfaces. The upper surfaces 21a of the second pads 21 are at the same level as (are flush with) the bottom surfaces of the recess portions 11x.

The thickness $T_4$ of each second pad 21 may be, for example, in a range of about 6 to 7 μm. The depth $D_4$ of each second pad 21 from the upper surface 12a of the insulating layer 12 is substantially equal to a value obtained by adding the depth $D_3$ and the depth of the step portion $Z_1$. For example, the depth $D_4$ of each second pad 21 may be in a range of about 3 to 4 μm The adjacent portion of the solder resist layer 19 adjacent to the peripheral portion of each opening portion 19x extends from the upper surface 12a of the insulating layer 12 to the inside of the corresponding recess portion 12y and covers the inner side wall (step portion $Z_1$) of the corresponding recess portion 12y and the upper peripheral portion 11z of the corresponding first pad 11. Furthermore, the adjacent portion of the solder resist layer 19 adjacent to the peripheral portion of each opening portion 19x protrudes from the upper peripheral portion 11z of the corresponding first pad 11 laterally (in a horizontal direction; toward the center portion of each first pad 11) so as to cover above the recess portion 11x of the corresponding first pad 11. More specifically, the adjacent portion of the solder resist layer 19 adjacent to the peripheral portion of each opening portion 19x protrudes from the upper peripheral portion 11z of the corresponding first pad 11 laterally so as to have an eave shape that covers above the recess portion 11x of the corresponding first pad 11. Similarly to the wiring substrate 10, a width W of the eave-shape protrusion portion of the solder resist layer 19 over the recess portion 11x may be, for example, in a range of about 1 to 2 μm.

[Method for Manufacturing Wiring Substrate According to Second Exemplary Embodiment]

Figure 12A:
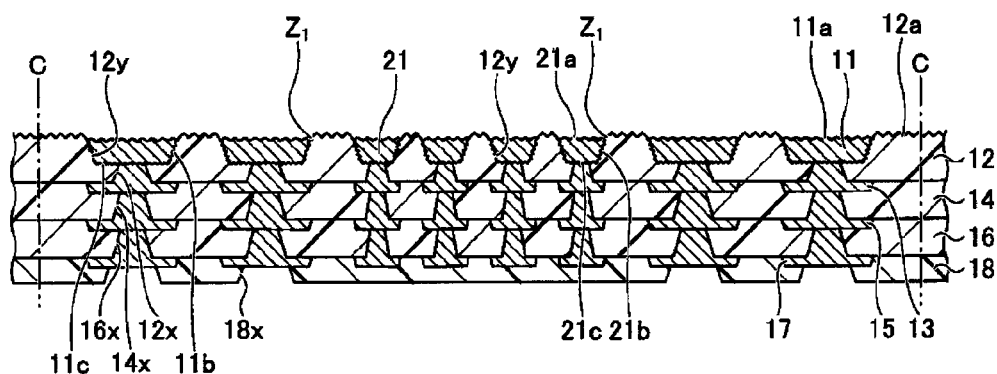
FIGS. 12A to 12C are a set of section views illustrating a manufacturing process of the wiring substrate according to the second exemplary embodiment.
Figure 12B:
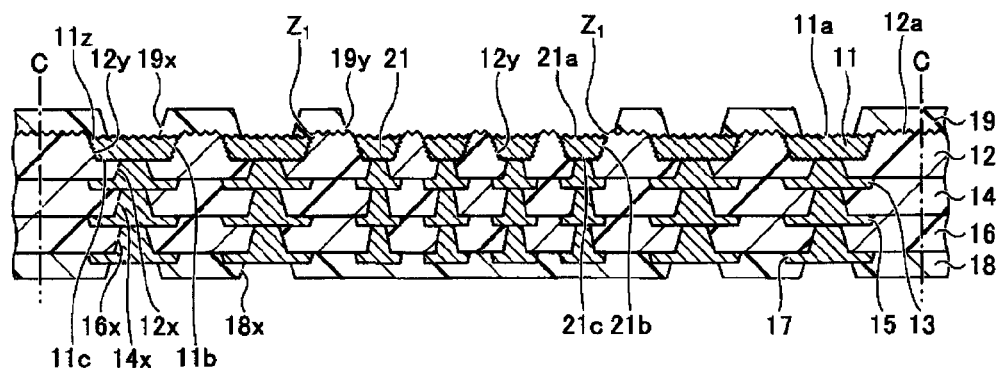
Figure 12C:
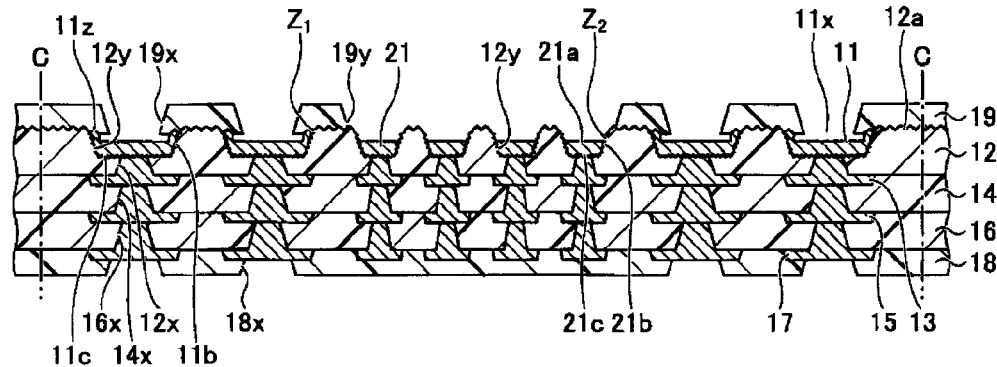

Next, a method for manufacturing the wiring substrate according to the second exemplary embodiment will be described. FIGS. 12A to 12C are section views illustrating processes for manufacturing the wiring substrate according to the second exemplary embodiment. In the second exemplary embodiment, plural parts to become plural wiring substrates are formed on a support body and are divided into individual parts after removal of the support body. However, one wiring substrate may be formed on a support body, and the support body may be removed thereafter.

At first, similar steps to those shown in FIGS. 3A to 5C are performed. Then, in the step of FIG. 12A, a par to the first pads 11 exposed which is exposed from the insulating layer is removed by etching. Thereby, the upper surfaces 11a (the upper surfaces 11a) of the first pads 11 are roughened. Simultaneously, a part of the second pads 21 and a part of the wirings 22, which are exposed from the insulating layer 12, are removed by etching. Thereby, the upper surfaces 21a of the second pads 21 and the upper surfaces of the wiring patterns 22 are roughened.

The upper surface 11a of each first pad 11 is etched so as to be exposed, at a lower position than the upper surface 12a of the insulating layer 12, to the inside of the corresponding recess portion 12y. Therefore, the step portion $Z_1$ is provided between the upper surface 11a of each first pad 11 and the upper surface 12a of the insulating layer 12. In each step portion $Z_1$ for the first pad 11, the inner wall surface of the corresponding recess portion 12y is exposed. Similarly, the upper surface 21a of each second pad 21 is etched so as to be exposed, at a lower position than the upper surface 12a of the insulating layer 12, to the inside of the corresponding recess portion 12y. Also, the upper surface (not shown) of each wiring pattern 22 is etched so as to be exposed, at a lower position than the upper surface 12a of the insulating layer 12, to the inside of the corresponding recess portion 12y. Therefore, the step portion $Z_1$ is provided between the upper surface 21a of each second pad 21 and the upper surface 12a of the insulating layer 12. In each step portion $Z_1$ for the second pad 21, the inner wall surface of the corresponding recess portion 12y is exposed. Also, the step portion $Z_1$ is provided between the upper surface (not shown) of each wiring pattern 22 and the upper surface 12a of the insulating layer 12. In each step portion $Z_1$ for the wiring pattern 22, the inner wall surface of the corresponding recess portion 12y is exposed.

The roughness of the upper surfaces 11a of the first pads 11, the upper surfaces 21a of the second pads 21, and the upper surfaces (not shown) of the wiring patterns 22 may be, for example, substantially equal to the roughness of the lower surfaces 11c of the first pads 11. Specifically, the roughness Ra of the upper surfaces 11a of the first pads 11, the upper surfaces 21a of the second pads 21, and the upper surfaces (not shown) of the wiring patterns 22 is equal to or higher than about 0.2 μm and lower than about 0.3 μm. Also, the roughness of the inner wall surface, in the step portion $Z_1$, of each recess portion 12y is substantially equal to or smaller than that of the upper surface 11a of the corresponding first pad 11.

The forming of the step portions $Z_1$ and the roughening of the upper surfaces 11a of the first pads 11, the upper surfaces 21a of the second pads 21, and the upper surfaces (not shown) of the wiring patterns 22 may be performed using, for example, a formic-acid-based or acetic-acid-based etching solution. The step portions $Z_1$ may be, for example, about 2 µm in depth. It is noted that FIGS. 12A to 12C are inverted from FIGS. 3A to 5C in the top-bottom direction.

Next, in a step of FIG. 12B, the solder resist layer 19 is formed on the other surface (upper surface) 12a of the insulating layer 12 so as to have opening portions 19x and 19y. More specifically, an adjacent portion of the solder resist layer 19 adjacent to a peripheral portion of each opening portion 19x extends to the inside of the corresponding recess portion 12y so as to cover the inner wall surface (step portion $Z_1$) of the corresponding recess portion 12y and the upper peripheral portion 11z of the corresponding first pad 11. The solder resist layer 19 and its opening portions 19x, 19y may be formed, for example, by the same method as the solder resist layer 18 and its opening portions 18x.

Next, in a step of FIG. 12C, the recess portions 11x and step portions $Z_2$ are formed as preprocessing for formation of surface treatment layers 20. Specifically, the recess portions 11x are formed in the first pads 11. Also, the step portions $Z_2$ are formed for the second pads 21 so as to expose upper portions of the inner wall surfaces of the recess portions 12y corresponding to the second pads 21. More specifically, a part of each first pad 11 exposed to the inside of the corresponding opening portion 19x of the solder resist layer 19 is removed, and the recess portion 11x having a smooth bottom surface is formed. The adjacent portion of the solder resist layer 19 adjacent to the peripheral portion of each opening portion 19x protrudes from the upper peripheral portion 11z of the corresponding first pad 11 laterally (in a horizontal direction toward a center portion of the corresponding first pad 11) so as to cover above the corresponding recess portion 11. More specifically, the adjacent portion of the solder resist layer 19 adjacent to the peripheral portion of each opening portion 19x protrudes from the upper peripheral portion 11z of the corresponding first pad 11 laterally so as to have an eave shape that covers above the corresponding recess portion 11x.

Also, a part of each second pad 21 exposed to the inside of the corresponding opening portion 19y of the solder resist layer 19 is removed, and the step portion $Z_1$ which exposes the inner wall surface of the corresponding recess portion 12 is formed. The upper surface 21a of each second pad 21 is a smooth surface. Also, the upper surfaces 21a of the second pads 21 are at a lower level than the other surface (upper surface) 12a of the insulating layer 12. The upper surfaces 21a of the second pads 21 are at the same level as (are flush with) the bottom surfaces of the recess portions 11x. The roughness of the inner wall surfaces (smooth surfaces) and bottom surfaces (smooth surfaces) of the recess portions 11x and the upper surfaces 21a of the second pads 21 may be the same as those in the first exemplary embodiment. Also, the etching solution used may be the same as that used in the first exemplary embodiment.

After the step of FIG. 12C, the surface treatment layer 20 is formed on the bottom surface and inner wall surface of each recess portion 11x. Also, the surface treatment layer 20 is formed on the upper surface 21a of each second pad 21. Then, the resulting structure is cut at cutting positions C by dicing or the like into individual parts. Thereby, plural wiring substrates 10B (see FIGS. 11A and 11B) are obtained.

As described above, in the wiring substrate 10B according to the second exemplary embodiment, the upper surface 11a of each first pad 11 is at a lower level than the upper surface 12a of the insulating layer 12. The step portion $Z_1$ is provided between the upper surface 11a of each first pad 11 and the upper surface 12a of the insulating layer 12. In each step portion $Z_1$, the inner wall surface of the corresponding recess portion 12y is exposed. The adjacent portion of the solder resist layer 19 adjacent to the peripheral portion of each opening portion 19x extends from the upper surface 12a of the insulating layer 12 to the inside of the corresponding recess portion 12y and covers the inner side wall (step portion $Z_1$) of the corresponding recess portion 12y and the upper peripheral portion 11z of the corresponding first pad 11.

With this configuration, in addition to the advantages that the first exemplary embodiment provides, the wiring substrate 10B further offers the following advantages. That is, in the second exemplary embodiment, the solder resist layer 19 covers the inner wall surfaces (step portions $Z_1$) of the recess portions 12y. Thereby, a large contact area between the solder resist layer 19 and the insulating layer 12 is ensured, which more reliably prevents the first pads 11 from coming off

[Clauses]

This disclosure further encompasses various exemplary embodiments, for example, described below.

1. A method for manufacturing a wiring substrate, the method comprising:
    forming a metal layer on a support body, one surface of the metal layer being a roughened surface;
    forming a first pad on the one surface of the metal layer;
    roughening surfaces of the first pad, which are exposed from the metal layer so that the roughened surfaces of the first pad are smaller in roughness than the one surface of the metal layer;
    forming an insulating layer on the one surface of the metal layer so that the insulating layer covers the roughened surfaces of the first pad;
    removing the support body;
    removing the metal layer to transfer the roughened one surface of the metal layer to (i) an upper surface of the insulating layer, which was in contact with the metal layer, and (ii) an upper surface of the first pad, which was in contact with the metal layer;
    forming a solder resist layer on the upper surface of the insulating layer, wherein
        the solder resist layer is formed with an opening portion through which a part of the upper surface of the first pad is exposed, and
        the solder resist layer covers an upper peripheral portion of the first pad;
    removing a part of the first pad, which is exposed to an inside of the opening portion of the solder resist layer, to form a recess portion having a smooth bottom surface, wherein
        an adjacent portion of the solder resist layer adjacent to a peripheral portion of the opening portion protrudes from the upper peripheral portion of the first pad toward a center portion of the first pad and covers above the recess portion.

2. A method for manufacturing a wiring substrate, the method comprising:
    forming a metal layer on a support body, one surface of the metal layer being a roughened surface;
    forming a first pad and second pads on the one surface of the metal layer;
    roughening surfaces of the first pad, which are exposed from the metal layer, and surfaces of the second pads, which are exposed from the metal layer, so that the roughened surfaces of the first pad and the roughened surfaces of the second pads are smaller in roughness than the one surface of the metal layer;
    forming an insulating layer on the one surface of the metal layer so that the insulating layer covers the roughened surfaces of the first pad and the roughened surfaces of the second pads;
    removing the support body;

removing the metal layer to transfer the roughened one surface of the metal layer to (i) an upper surface of the insulating layer, which was in contact with the metal layer, (ii) an upper surface of the first pad, which was in contact with the metal layer, and (iii) upper surfaces of the second pads, which were in contact with the metal layer;

forming a solder resist layer on the upper surface of the insulating layer, wherein the solder resist layer is formed with an opening portion through which a part of the upper surface of the first pad is exposed, and other opening portions through which the upper surfaces of the plural second pads are exposed, and the solder resist layer covers an upper peripheral portion of the first pad;

removing a part of the first pad, which is exposed to an inside of the opening portion of the solder resist layer, to form a recess portion having a smooth bottom surface while removing a part of each second pad so that the upper surfaces of the second pads are at lower level than the upper surface of the insulating layer, wherein an adjacent portion of the solder resist layer adjacent to a peripheral portion of the opening portion protrudes from the upper peripheral portion of the first pad toward a center portion of the first pad and covers above the recess portion, and the upper surfaces of the second pads are at the same level as a bottom surface of the recess portion.

3. The method according to the clause 2, further comprising:

before the forming of the solder resist layer, removing a part of the upper surface of the first pad, which is exposed from the insulating layer, and a part of the upper surface of each second pad, which is exposed from the insulating layer, by etching.

The exemplary embodiments and its modifications have been described above in detail. However, the invention is not limited thereto. Various modifications and replacements can be made in the above exemplary embodiments and its modifications without departing from the scope of the invention.

What is claimed is:

1. A wiring substrate, comprising:
an insulating layer;
a first pad that is embedded in the insulating layer, wherein
an upper surface of the first pad is exposed from an upper surface of the insulating layer, and
the first pad is formed with a recess portion, having a smooth bottom surface, at a center portion of the upper surface of the first pad; and
a solder resist layer that is provided on the upper surface of the insulating layer and that is formed with an opening portion through which the recess portion is exposed, wherein
an adjacent portion of the solder resist layer adjacent to a peripheral portion of the opening portion covers a peripheral portion of the upper surface of the first pad,
the adjacent portion of the solder resist layer protrudes from the peripheral portion of the upper surface of the first pad toward the center portion of the first pad so as to cover above the recess portion,
the upper surface of the insulating layer, surfaces of the first pad being in contact with the insulating layer, and the peripheral portion of the upper surface of the first pad are roughened, and the surfaces of the first pad being in contact with the insulating layer are smaller in roughness than the upper surface of the insulating layer and the peripheral portion of the upper surface of the first pad.

2. The wiring substrate according to claim 1, wherein the adjacent portion of the solder resist layer protrudes from the peripheral portion of the upper surface of the first pad toward the center portion of the first pad so as to have an eaves shape that covers above the recess portion.

3. The wiring substrate according to claim 1, further comprising:
a second pad that is embedded in the insulating layer and that is exposed from the upper surface of the insulating layer, wherein
an upper surface of the second pad is recessed from the upper surface of the insulating layer, and
the upper surface of the second pad is on the same level as the bottom surface of the recess portion.

4. The wiring substrate according to claim 3, wherein the upper surface of the first pad is at a lower level than the upper surface of the insulating layer.

5. The wiring substrate according to claim 3, wherein the upper surface of the second pad is a smooth flat surface.

6. The wiring substrate according to claim 3, wherein
surfaces of the second pad being in contact with the insulating layer are roughened, and
the surfaces of the second pad being in contact with the insulating layer are smaller in roughness than the upper surface of the insulating layer and the peripheral portion of the upper surface of the first pad.

7. The wiring substrate according to claim 3, wherein the solder resist layer is formed with another opening portion through which the second pad is exposed.

8. The wiring substrate according to claim 1, further comprising:
a surface treatment layer that covers the bottom surface of the recess portion and an inner wall surface of the recess portion and that does not fill the recess portion.

9. The wiring substrate according to claim 8, wherein
the surface treatment layer includes
a bottom surface extending along the bottom surface of the recess portion, and
an inner wall surface extending along the inner wall surface of the recess portion.

10. The wiring substrate according to claim 3, further comprising:
another surface treatment layer that is formed on the upper surface of the second pad, and
said another surface treatment layer is recessed from the upper surface of the insulating layer.

11. The wiring substrate according to claim 1, wherein
the first pad has a tapered shape in section, and
a width of the tapered shape in a vicinity of a lower surface of the first pad is narrower than that of the tapered shape in a vicinity of the upper surface of the insulating layer.

12. The wiring substrate according to claim 1, wherein the roughnesses of the upper surface of the insulating layer and the peripheral portion of the upper surface of the first pad are in a range of 0.3 µm to 0.5 µm.

13. The wiring substrate according to claim 1, wherein
the roughnesses of the surfaces of the first pad being in contact with the insulating layer are in a range of 0.2 µm to 0.3 µm.

14. The wiring substrate according to claim 1, wherein the peripheral portion of the upper surface of the first pad flushes with the upper surface of the insulating layer.

* * * * *